(12) United States Patent
Wang et al.

(10) Patent No.: US 12,419,097 B2
(45) Date of Patent: Sep. 16, 2025

(54) SEMICONDUCTOR DEVICE STRUCTURE AND METHOD FOR FORMING THE SAME

(71) Applicant: Taiwan Semiconductor Manufacturing Company, Ltd., Hsin-Chu (TW)

(72) Inventors: Yin Wang, New Taipei (TW); Chunyao Wang, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 460 days.

(21) Appl. No.: 17/832,599

(22) Filed: Jun. 4, 2022

(65) Prior Publication Data
US 2023/0119827 A1    Apr. 20, 2023

Related U.S. Application Data

(60) Provisional application No. 63/257,928, filed on Oct. 20, 2021.

(51) Int. Cl.
| | |
|---|---|
| *H10D 64/66* | (2025.01) |
| *H01L 21/28* | (2006.01) |
| *H10D 30/01* | (2025.01) |
| *H10D 30/62* | (2025.01) |
| *H10D 62/13* | (2025.01) |

(52) U.S. Cl.
CPC ..... *H10D 64/671* (2025.01); *H01L 21/28123* (2013.01); *H10D 30/024* (2025.01); *H10D 30/6211* (2025.01); *H10D 62/151* (2025.01)

(58) Field of Classification Search
None
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |

(Continued)

FOREIGN PATENT DOCUMENTS

| | | |
|---|---|---|
| KR | 20080059957 A | 7/2008 |
| KR | 20210123207 A | 10/2021 |
| TW | 202139356 A | 10/2021 |

*Primary Examiner* — Michelle Mandala
(74) *Attorney, Agent, or Firm* — HAYNES AND BOONE, LLP

(57) ABSTRACT

A semiconductor device structure is provided. The semiconductor device structure includes a substrate. The semiconductor device structure includes a gate stack formed over the substrate. The semiconductor device structure includes a spacer structure formed over a sidewall of the gate stack. The spacer structure includes a dielectric layer, a silicon rich layer, and a protection layer. The dielectric layer is formed between the gate stack and the silicon rich layer. The silicon rich layer is formed between the dielectric layer and the protection layer. A first atomic percentage of silicon in the silicon rich layer is greater than about 50%. The semiconductor device structure includes a source/drain structure formed over the substrate. The spacer structure is formed between the source/drain structure and the gate stack.

20 Claims, 50 Drawing Sheets

(56) References Cited

U.S. PATENT DOCUMENTS

| | | |
|---|---|---|
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2009/0108359 A1* | 4/2009 | Rossi ................ H01L 21/76831 |
| | | 257/E27.06 |
| 2011/0241128 A1 | 10/2011 | O'Meara |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0179766 A1 | 6/2015 | Zang |
| 2016/0260820 A1 | 9/2016 | Li |
| 2019/0006506 A1 | 1/2019 | Greene |
| 2020/0105535 A1 | 4/2020 | Lin |
| 2020/0365448 A1* | 11/2020 | Lin ................... H01L 21/02348 |
| 2021/0036152 A1* | 2/2021 | Tsai ...................... H01L 27/088 |

* cited by examiner

SEMICONDUCTOR DEVICE STRUCTURE AND METHOD FOR FORMING THE SAME

PRIORITY CLAIM AND CROSS-REFERENCE

This application claims the benefit of U.S. Provisional Application No. 63/257,928, filed on Oct. 20, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2A-1 to 2J-1 are cross-sectional side views illustrating the semiconductor device structure along a sectional line I-I' in FIGS. 2A-2J, in accordance with some embodiments.

FIGS. 2A-2 to 2J-2 are cross-sectional side views illustrating the semiconductor device structure along a sectional line II-II' in FIGS. 2A-2J, in accordance with some embodiments.

FIG. 2B-3 is an enlarged view of a region of the semiconductor device structure of FIG. 2B-1, in accordance with some embodiments.

FIGS. 4A-1 to 4D-1 are cross-sectional side views illustrating the semiconductor device structure along a sectional line I-I' in FIGS. 4A-4D, in accordance with some embodiments.

FIGS. 4A-2 to 4D-2 are cross-sectional side views illustrating the semiconductor device structure along a sectional line II-II' in FIGS. 4A-4D, in accordance with some embodiments.

DETAILED DESCRIPTION

Figure 1A:
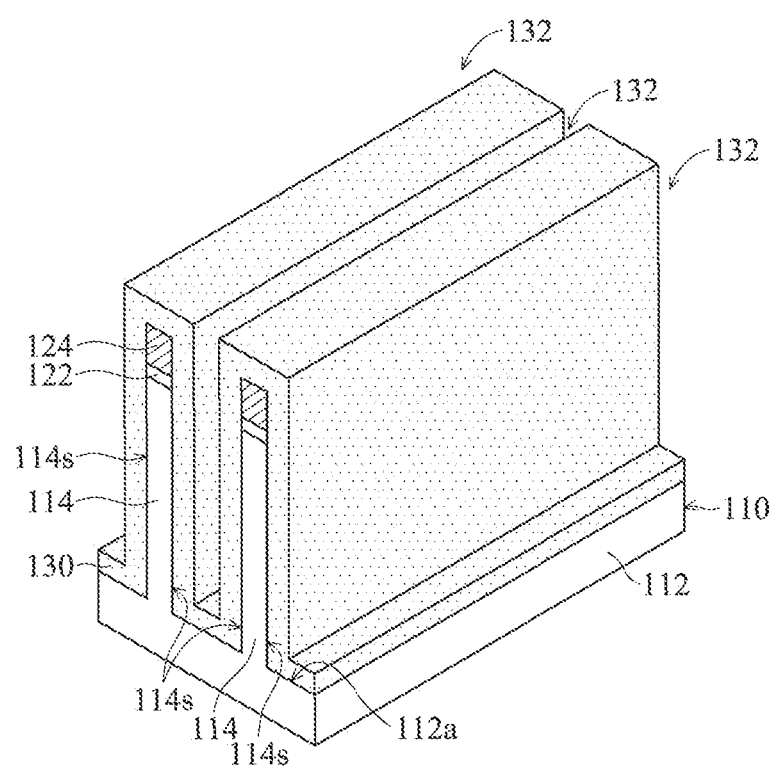
FIGS. 1A-1E are three-dimensional perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" or "about" in the description, such as in "substantially flat" or in "substantially level with", etc., will be understood by the person skilled in the art. In some embodiments the adjective substantially may be removed. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely", e.g., a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1E are three-dimensional perspective views of various stages of a process for forming a semiconductor device structure, in accordance with some embodiments. As shown in FIG. 1A, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

Afterwards, a first mask layer 122 and a second mask layer 124 may be successively formed over the substrate 110. In some embodiments, the first mask layer 122 serves a buffer layer or an adhesion layer that is formed between the underlying substrate 110 and the overlying second mask layer 124. The first mask layer 122 may also be used as an etch stop layer when the second mask layer 124 is removed or etched.

In some embodiments, the first mask layer 122 is made of silicon oxide. In some embodiments, the first mask layer 122 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second mask layer 124 is made of silicon oxide, silicon nitride, silicon oxynitride, or another applicable material. In some embodiments, the second mask layer 124 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the first mask layer 122 and the second mask layer 124, the first mask layer 122 and the overlying second mask layer 124 are patterned by a photolithography process and an etching process, so as to expose portions of the substrate 110. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, a neutral beam etching (NBE) process, the like, or a combination thereof.

Afterwards, an etching process is performed on the substrate 110 to remove portions of the substrate 110 by using the patterned first mask layer 122 and the patterned second mask layer 124 as an etch mask, in accordance with some embodiments. After the etching process, the substrate 110 has a base portion 112 and fin portions 114, in accordance with some embodiments. The fin portions 114 are over the base portion 112, in accordance with some embodiments. The fin portions 114 are spaced apart from each other, in accordance with some embodiments.

In some embodiments, the etching process includes a dry etching process or a wet etching process. In some embodiments, the substrate 110 is etched by a dry etching process, such as an RIE process, an NBE process, the like, or a combination thereof. The dry etching process may be performed using a process gas including fluorine-based etchant gas. For example, the process gas may include $SF_6$, $C_xF_y$ (x and y are both integers), $NF_3$ or a combination thereof.

In some other embodiments (not shown), the fin portions 114 have tapered sidewalls. For example, each of the fin portions 114 has a width that gradually increases from the top portion to the lower portion. The fin portion 114 has opposite sidewalls 114s, in accordance with some embodiments. The base portion 112 has a top surface 112a, in accordance with some embodiments.

As shown in FIG. 1A, an isolation layer 130 is formed over the base portion 112, the fin portions 114, the first mask layer 122, and the second mask layer 124, in accordance with some embodiments. The isolation layer 130 conformally covers the first mask layer 122, the second mask layer 124, the top surface 112a of the base portion 112, and the sidewalls 114s of the fin portions 114, in accordance with some embodiments. The isolation layer 130 has trenches 132, in accordance with some embodiments.

In some embodiments, the isolation layer 130 is made of oxide (such as silicon oxide), fluorosilicate glass (FSG), a low-k dielectric material, and/or another suitable dielectric material. The isolation layer 130 may be deposited by an atomic layer deposition (ALD) process, a chemical vapor deposition (CVD) process, or another applicable process.

Figure 1B:
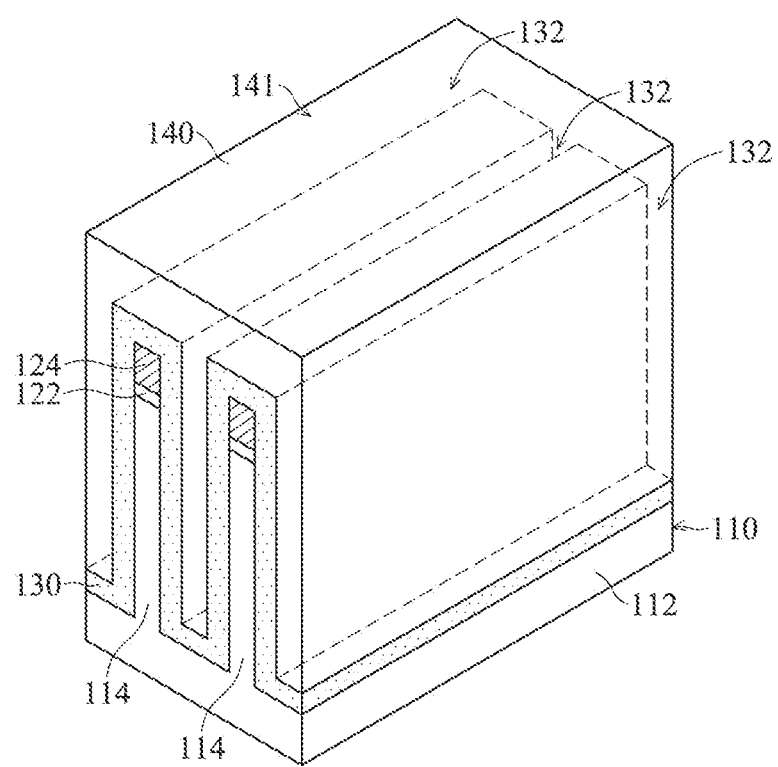

As shown in FIG. 1B, a dielectric layer 140 is formed over the isolation layer 130, in accordance with some embodiments. The trenches 132 of the isolation layer 130 are filled with the dielectric layer 140, in accordance with some embodiments.

The dielectric layer 140 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the isolation layer 130 and the dielectric layer 140 are made of different materials with different etching rates under an etchant. The dielectric layer 140 is formed using a deposition process, such as a chemical vapor deposition (CVD) process, an atomic layer deposition (ALD) process, or a physical vapor deposition (PVD) process, in accordance with some embodiments.

Figure 1C:
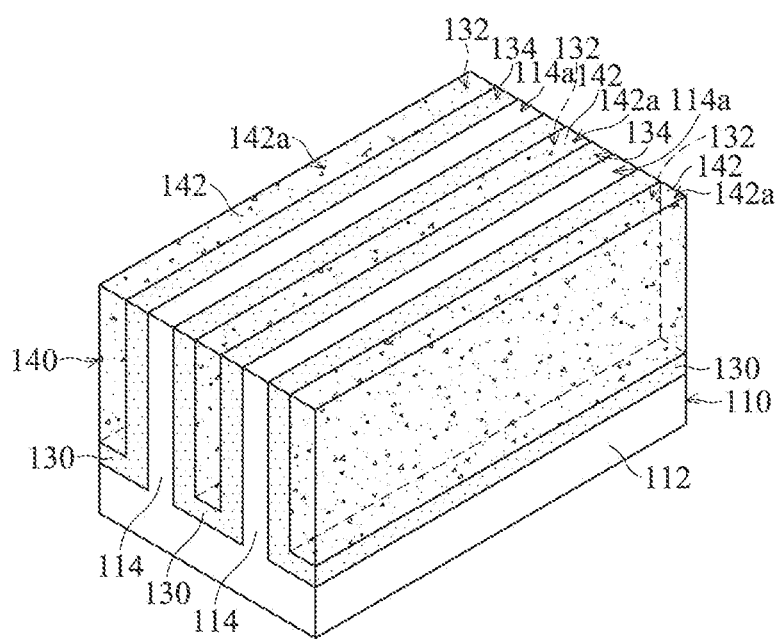

As shown in FIGS. 1B and 1C, top portions of the isolation layer 130 and the dielectric 140, the first mask layer 122, and the second mask layer 124 are removed, in accordance with some embodiments. In some embodiments, top portions of the fin portions 114 are also removed.

After the removal process, the dielectric layer 140 remaining in the trenches 132 forms dielectric fins 142, in accordance with some embodiments. The dielectric fins 142 are separated from each other by the fin portions 114 and the isolation layer 130, in accordance with some embodiments. The isolation layer 130 wraps around the dielectric fin 142, in accordance with some embodiments. The isolation layer 130 separates the dielectric fins 142 from the fin portions 114 and the base portion 112, in accordance with some embodiments.

In some embodiments, top surfaces 142a, 114a, and 134 of the dielectric fins 142, the fin portions 114, and the isolation layer 130 are substantially coplanar with (or level with) each other, in accordance with some embodiments. The term "substantially coplanar" in the application may include small deviations from coplanar geometries. The deviations may be due to manufacturing processes.

The removal process includes performing a thinning process on a top surface 141 of the dielectric layer 140, in accordance with some embodiments. The thinning process includes a chemical mechanical polishing (CMP) process, in accordance with some embodiments.

Figure 1D:
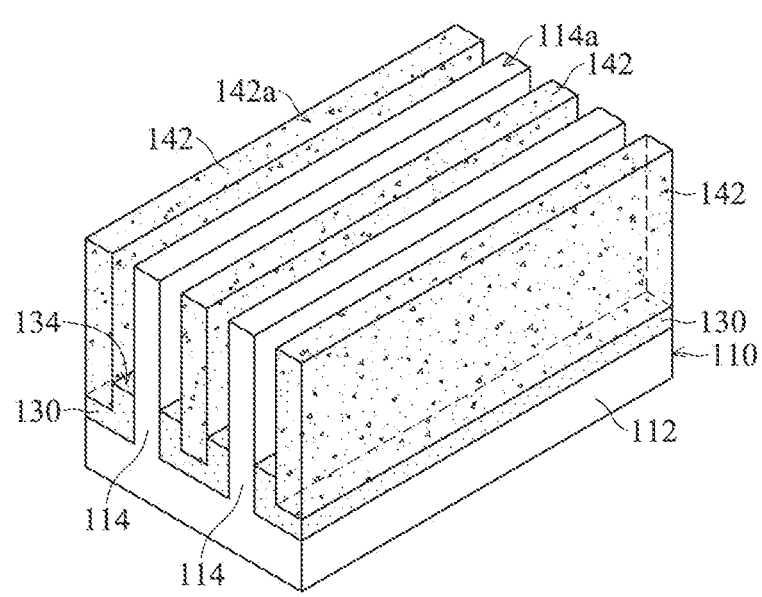

As shown in FIG. 1D, upper portions of the isolation layer 130 are removed, in accordance with some embodiments. After the removal process, the top surface 134 of the isolation layer 130 is lower than the top surfaces 142a and 114a of the dielectric fins 142 and the fin portions 114, in accordance with some embodiments. The removal process includes an etching process, such as a dry etching process or a wet etching process, in accordance with some embodiments.

Figure 1E:
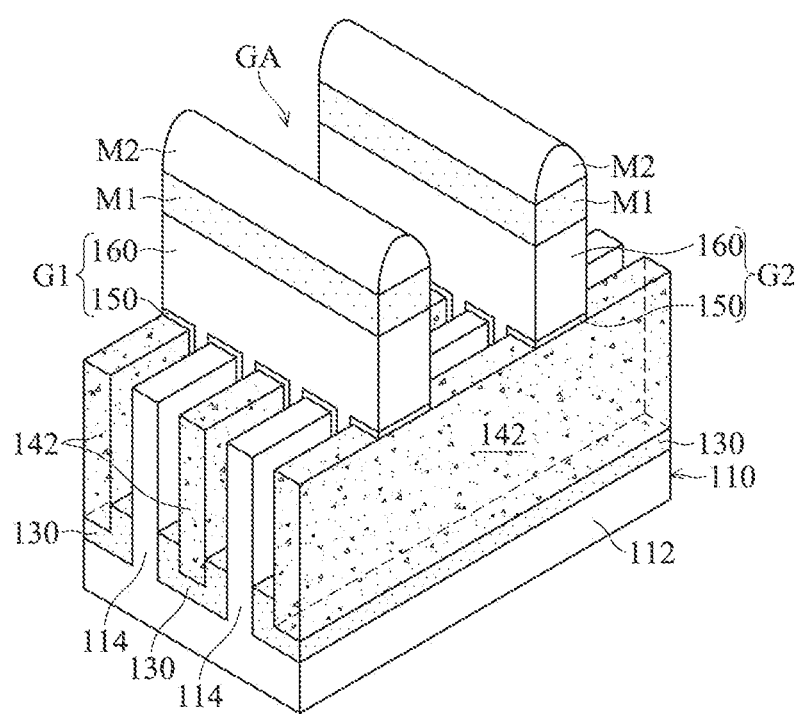
Figure 2A:
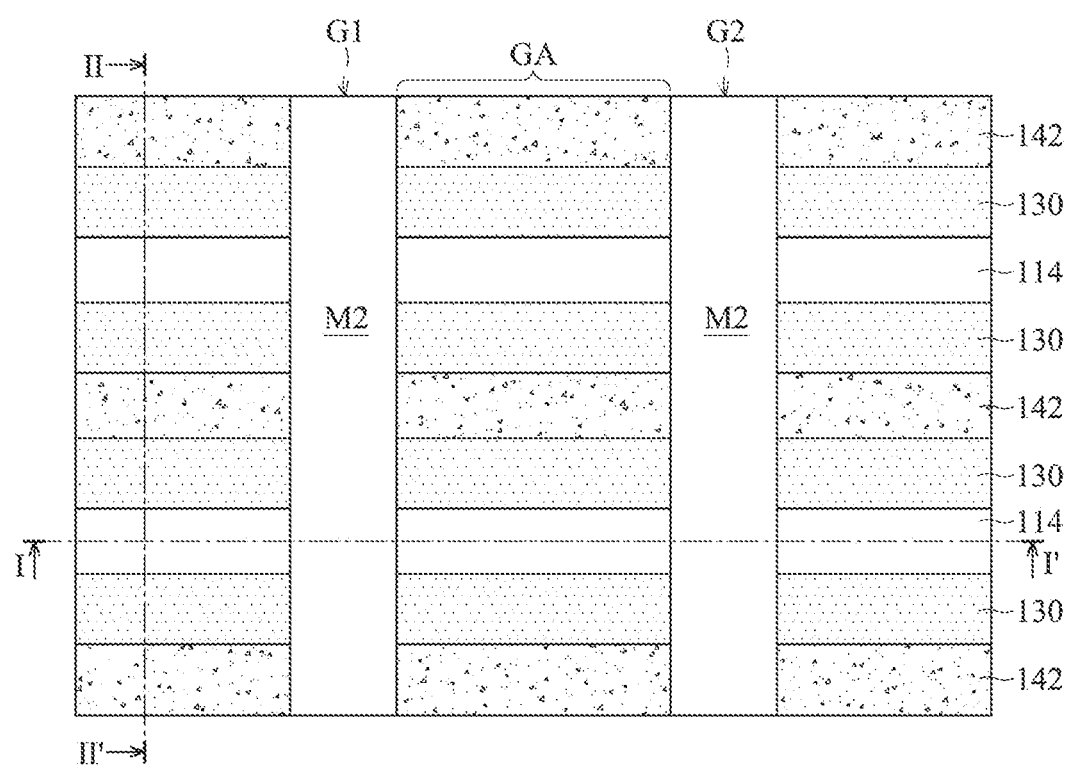
FIGS. 2A-2J are top views of various stages of a process for forming a semiconductor device structure, in accordance with some embodiments.
Figures 1, 2A:
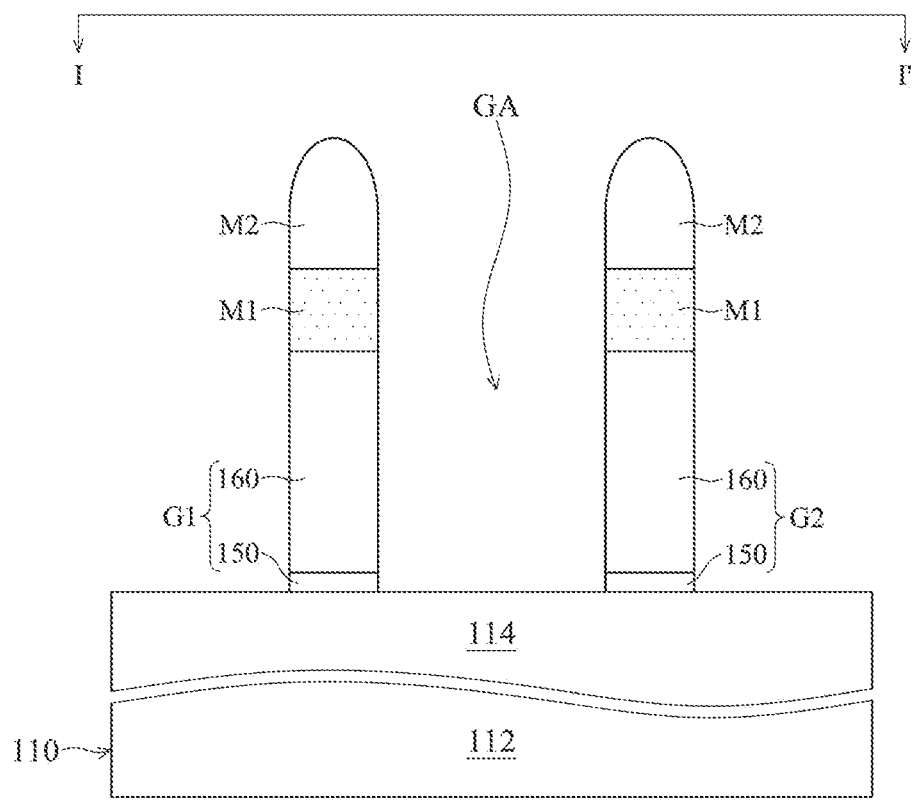
Figures 2, 2A:
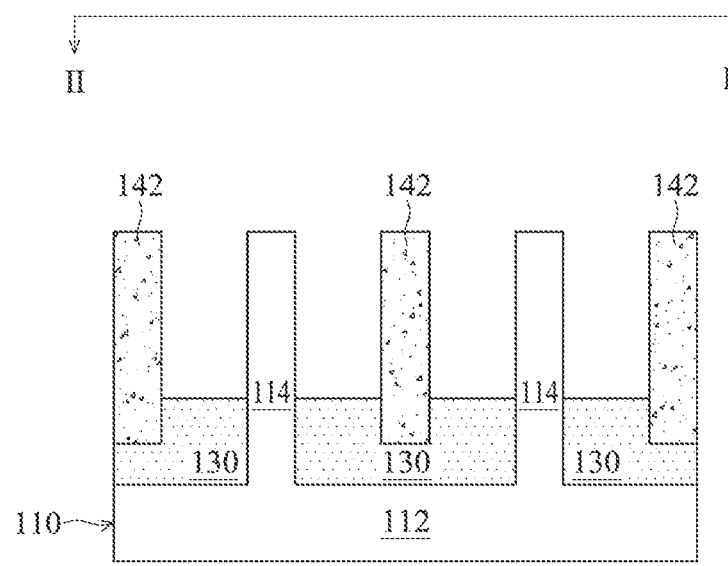

FIG. 2A is a top view of the semiconductor device structure of FIG. 1E, in accordance with some embodiments. FIG. 2A-1 is a cross-sectional side view illustrating the semiconductor device structure along a sectional line I-I' in FIG. 2A, in accordance with some embodiments. FIG. 2A-2 is a cross-sectional side view illustrating the semiconductor device structure along a sectional line II-II' in FIG. 2A, in accordance with some embodiments.

As shown in FIGS. 1E, 2A, 2A-1, and 2A-2, gate stacks G1 and G2 and mask layers M1 and M2 are formed over the fin portions 114, the isolation layer 130, and the dielectric fins 142, in accordance with some embodiments. The gate stacks G1 and G2 are spaced apart from each other by a gap GA, in accordance with some embodiments.

Each of the gate stacks G1 and G2 includes a gate dielectric layer 150 and a gate electrode 160, in accordance with some embodiments. The gate dielectric layer 150 is formed over the fin portions 114, the isolation layer 130, and the dielectric fins 142, in accordance with some embodiments. The gate electrode 160 is formed over the gate dielectric layer 150, in accordance with some embodiments.

The gate dielectric layer 150 is made of an insulating material, such as oxide (e.g., silicon oxide), in accordance with some embodiments. The gate electrode 160 is made of a semiconductor material (e.g. polysilicon) or a conductive material (e.g., metal or alloy), in accordance with some embodiments.

The formation of the gate dielectric layer 150 and the gate electrode 160 includes: depositing a gate dielectric material layer (not shown) over the fin portions 114, the isolation layer 130, and the dielectric fins 142; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder, in accordance with some embodiments.

In some embodiments, the mask layer M1 serves as a buffer layer or an adhesion layer that is formed between the underlying gate electrode 160 and the overlying mask layer M2. The mask layer M1 may also be used as an etch stop layer when the mask layer M2 is removed or etched. The mask layers M1 and M2 are made of different materials, in accordance with some embodiments.

In some embodiments, the mask layer M1 is made of oxide, such as silicon oxide. In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of nitride (e.g., silicon nitride), oxynitride (e.g., silicon oxynitride), or another applicable material. In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the deposition processes for forming the mask layers M1 and M2, the mask layers M1 and M2 are patterned by a photolithography process and an etching process, so as to expose the portions of the gate electrode material layer.

Figure 2B:
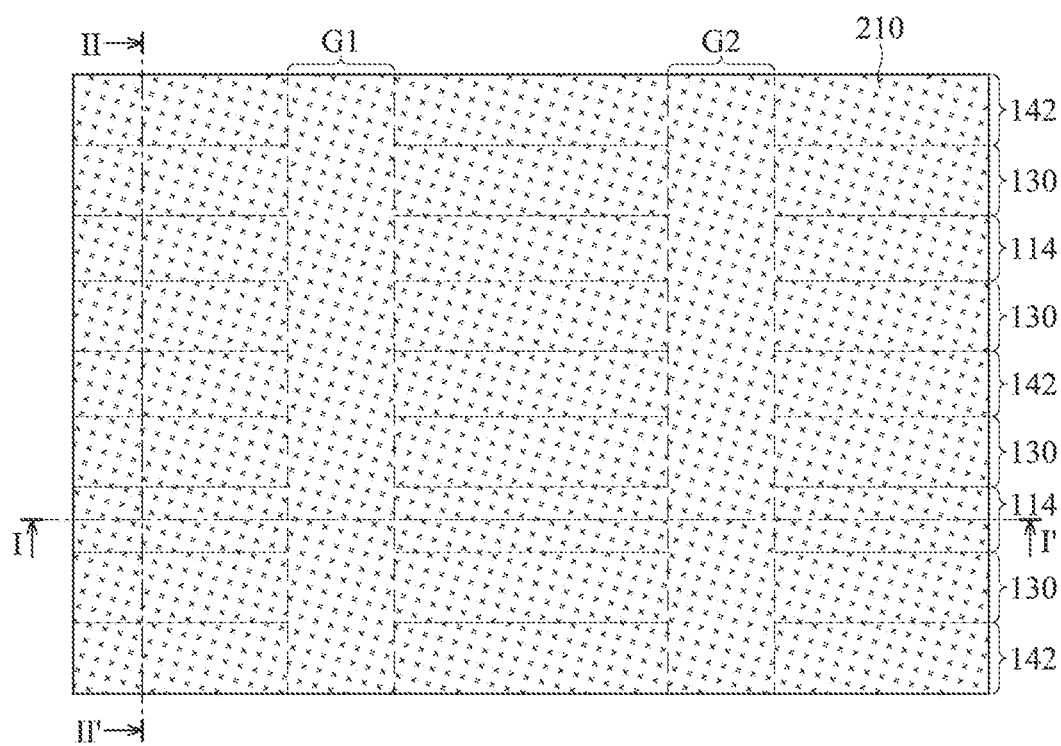
Figures 1, 2B:
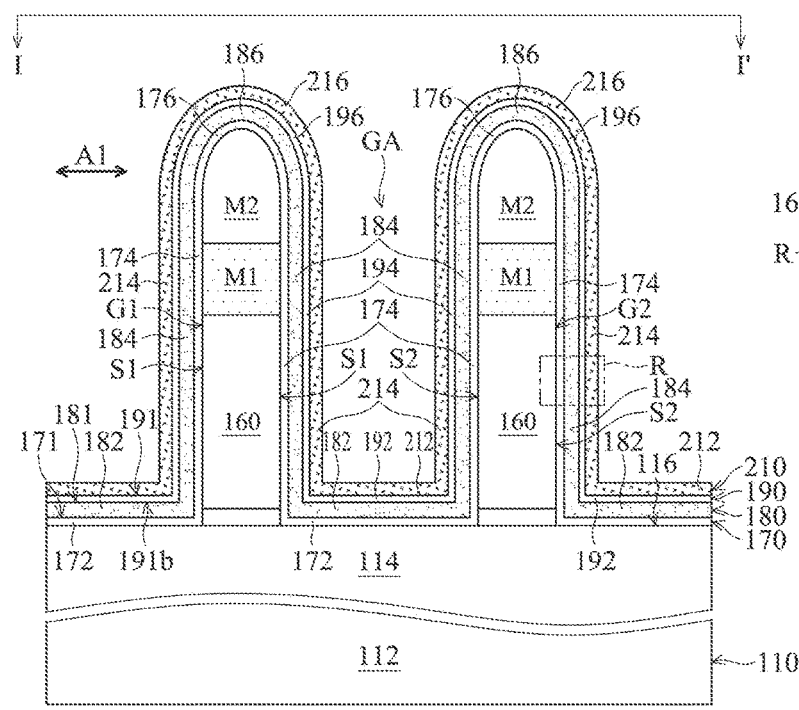
Figures 2, 2B, 3:
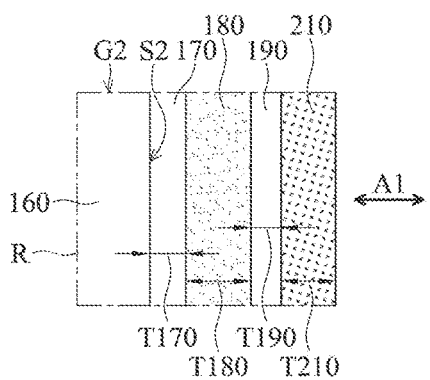
Figures 2, 2B:
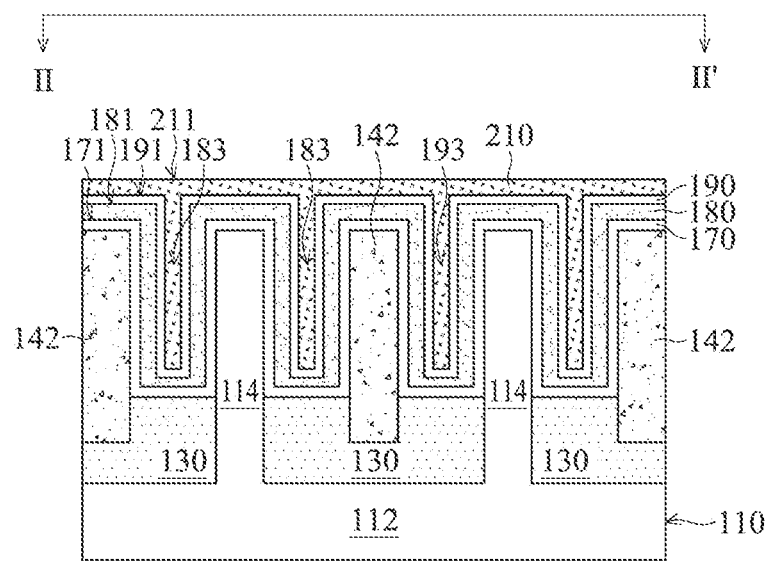
Figure 2C:
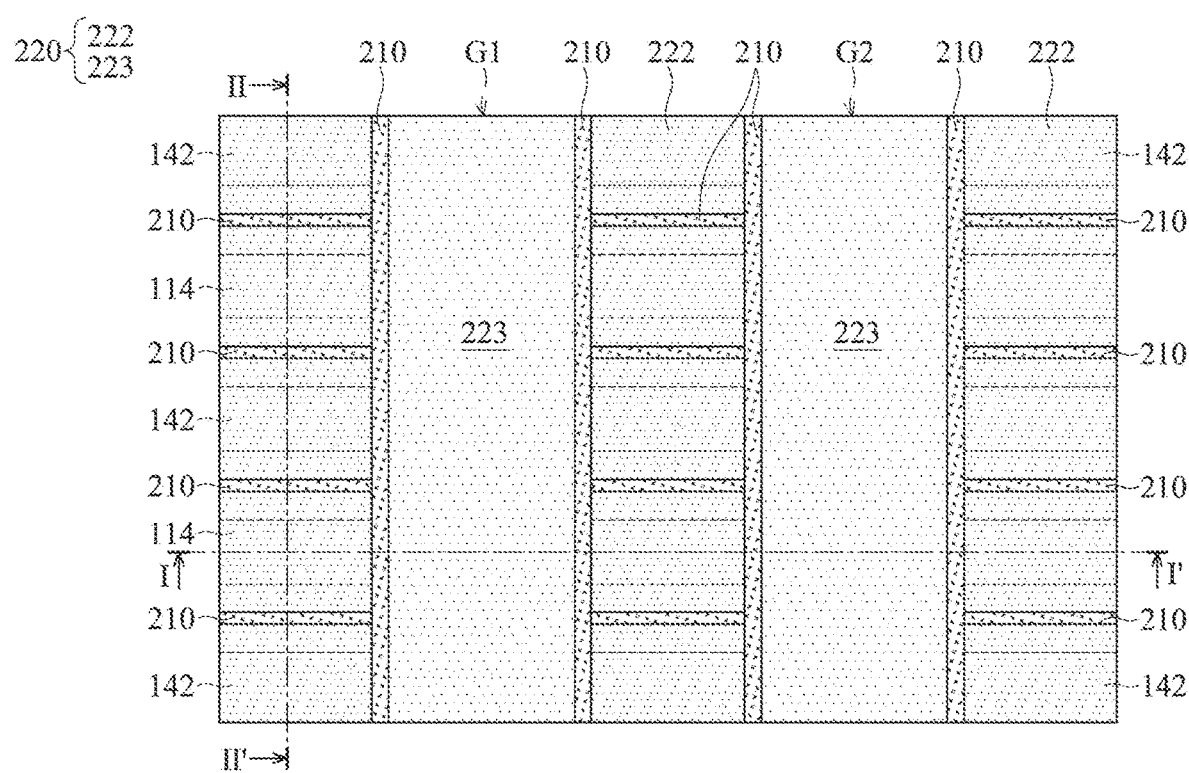
Figures 1, 2C:
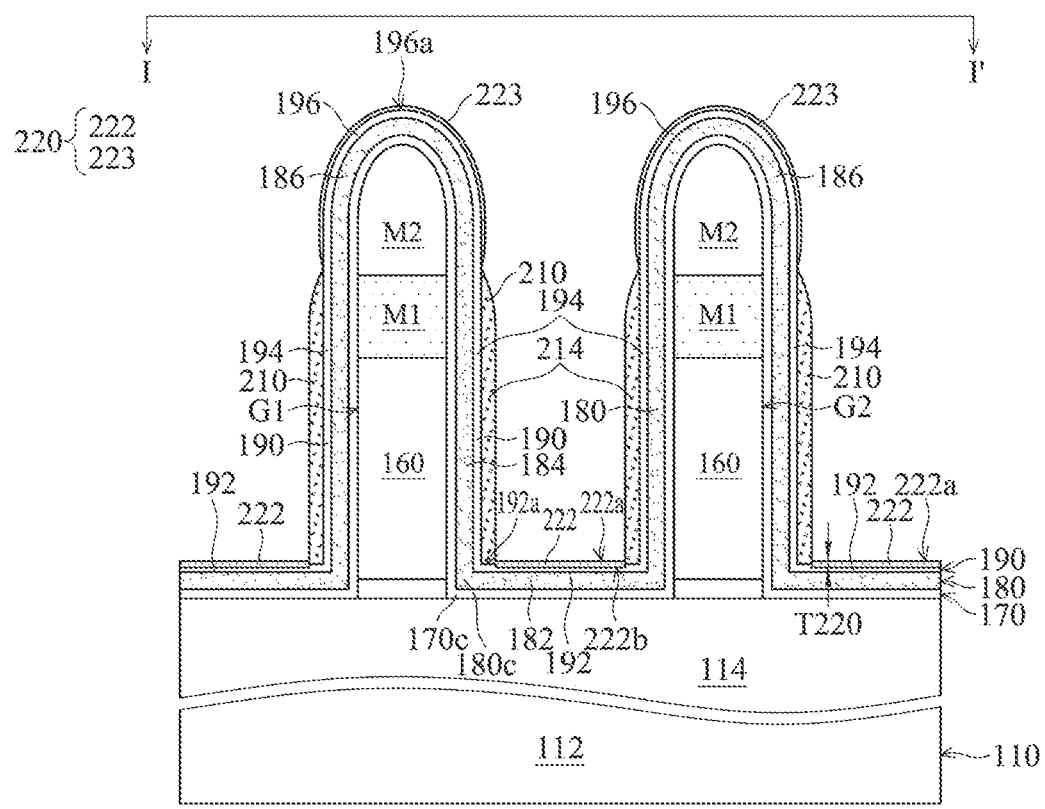
Figures 2, 2C:
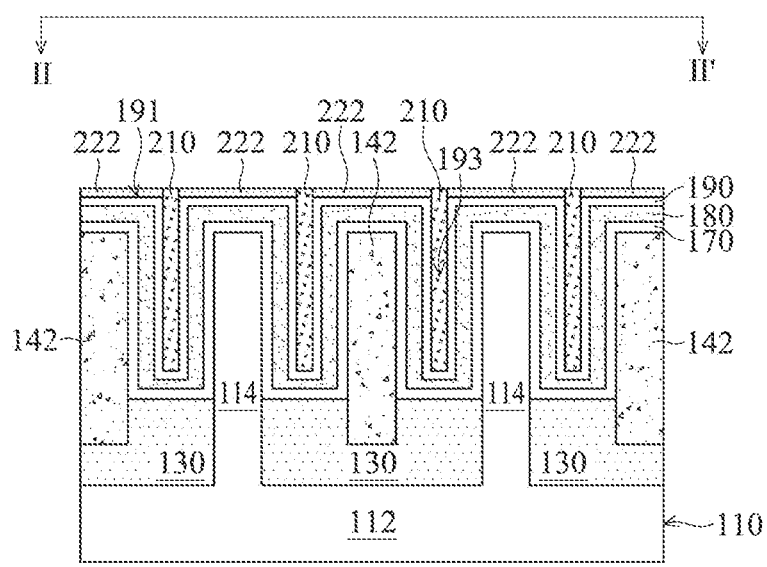
Figure 2D:
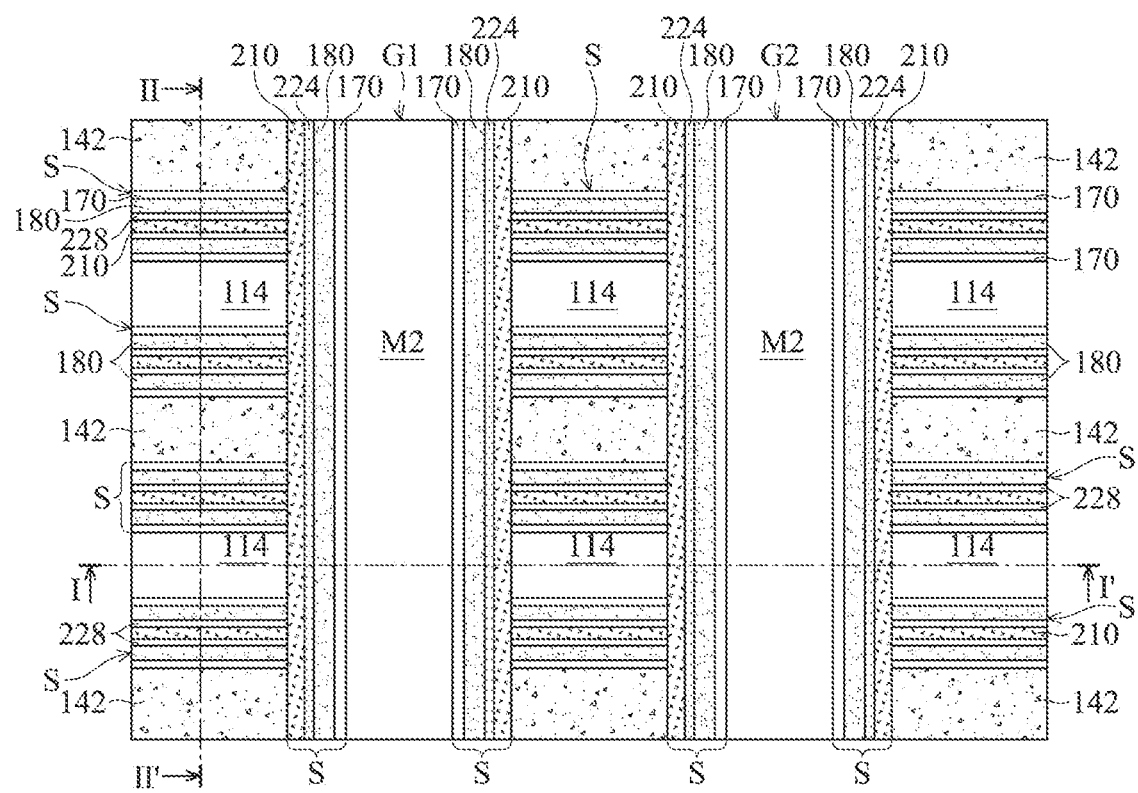
Figures 1, 2D:
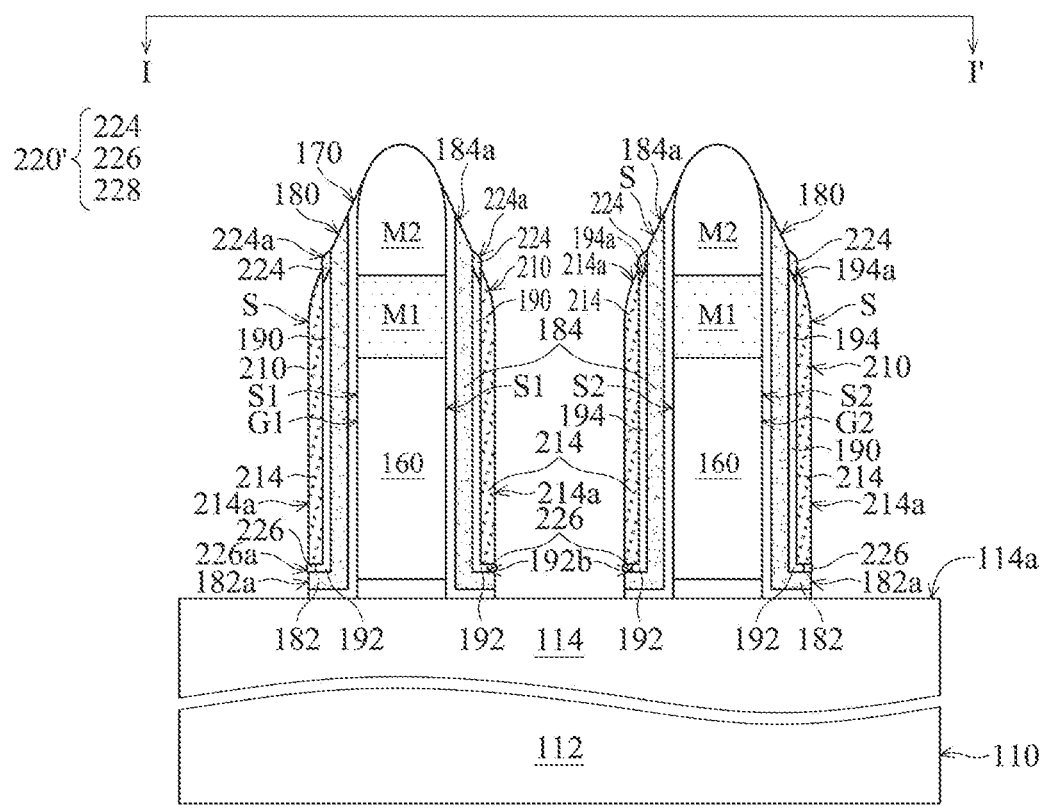
Figures 2, 2D:
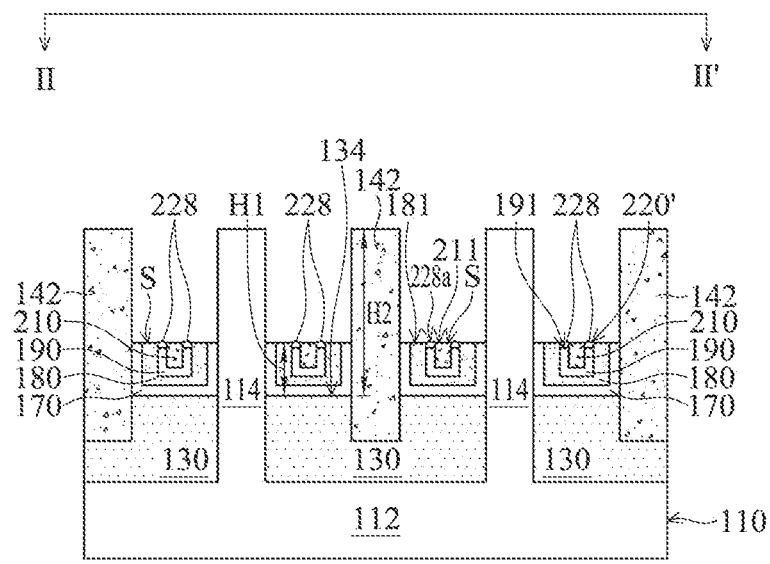
Figure 2E:
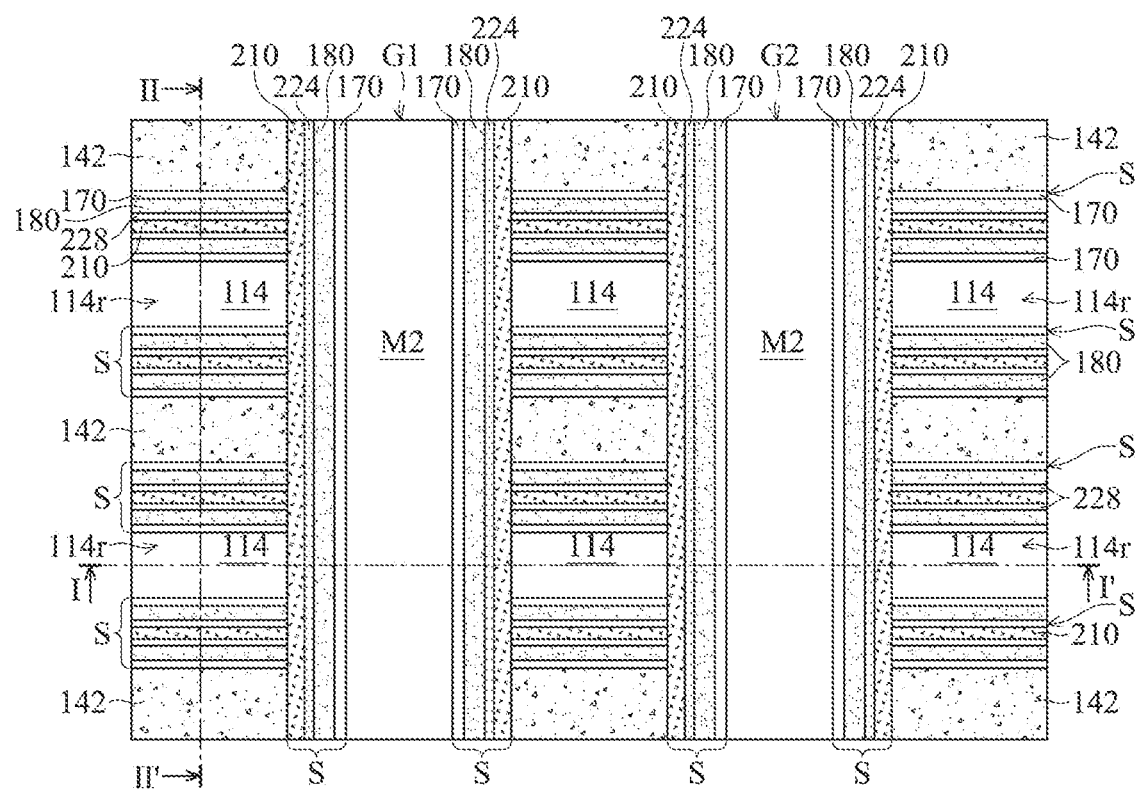
Figures 1, 2E:
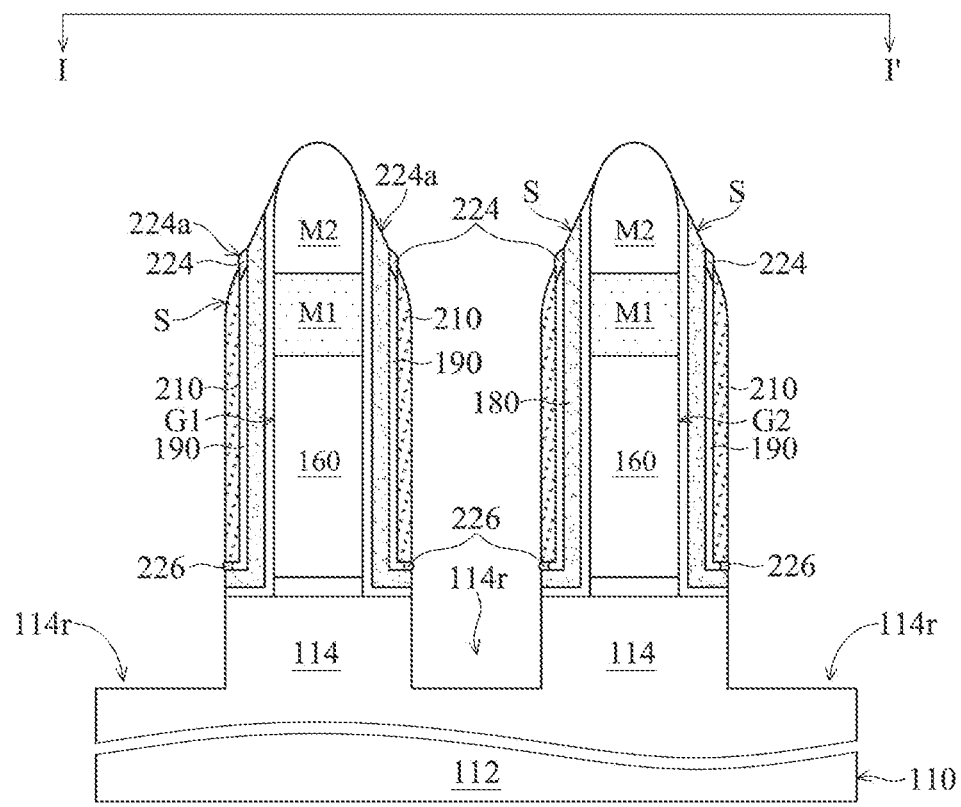
Figures 2, 2E:
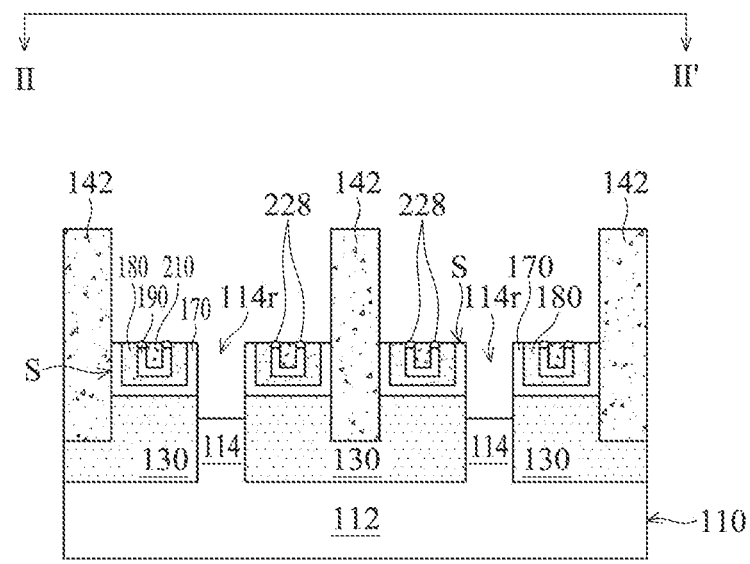
Figure 2F:
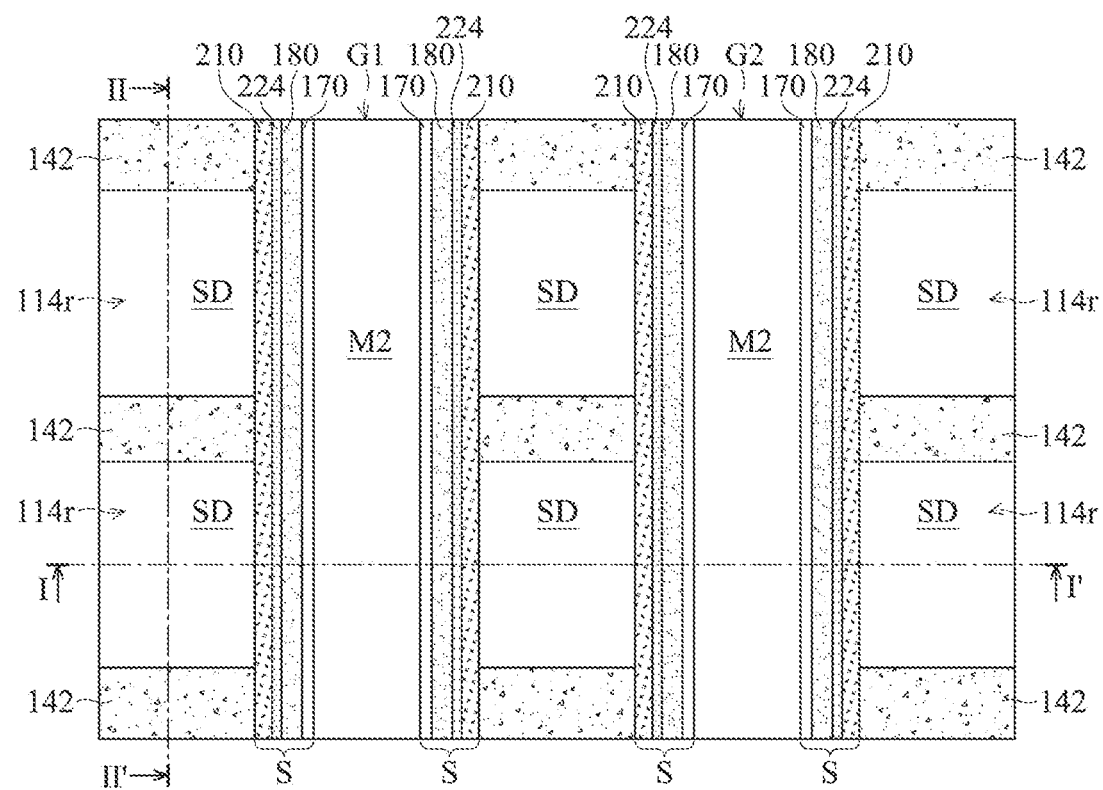
Figures 1, 2F:
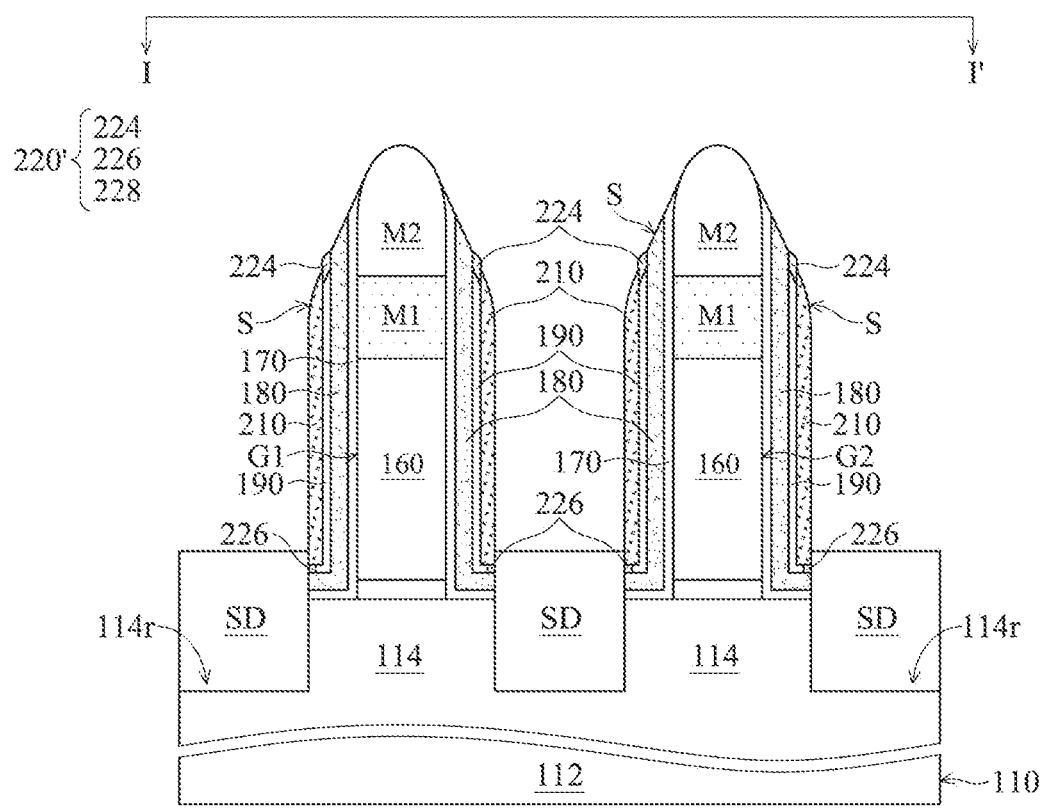
Figures 2, 2F:
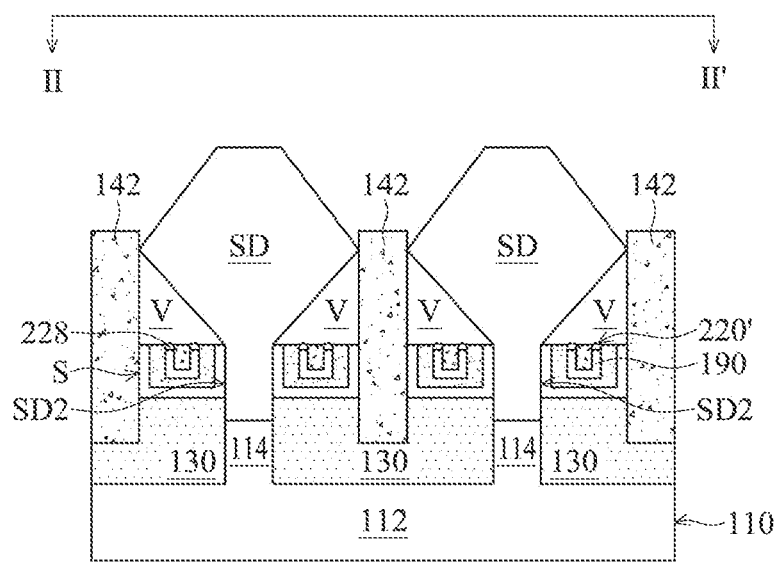
Figure 2G:
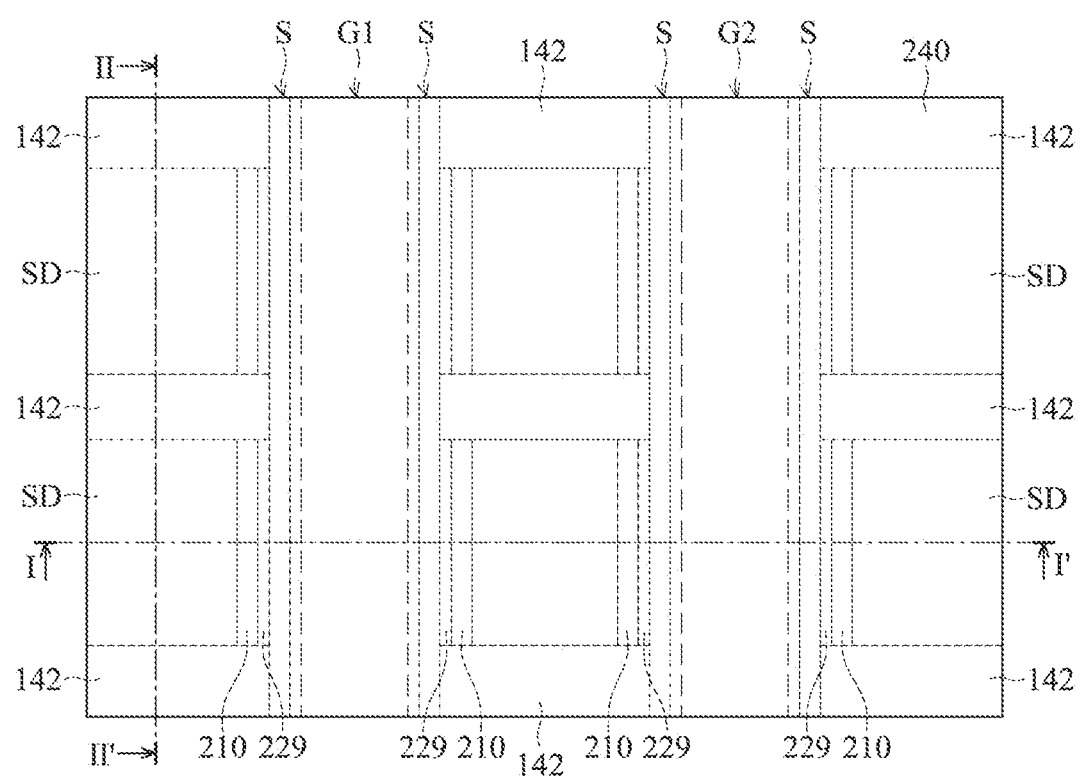
Figures 1, 2G:
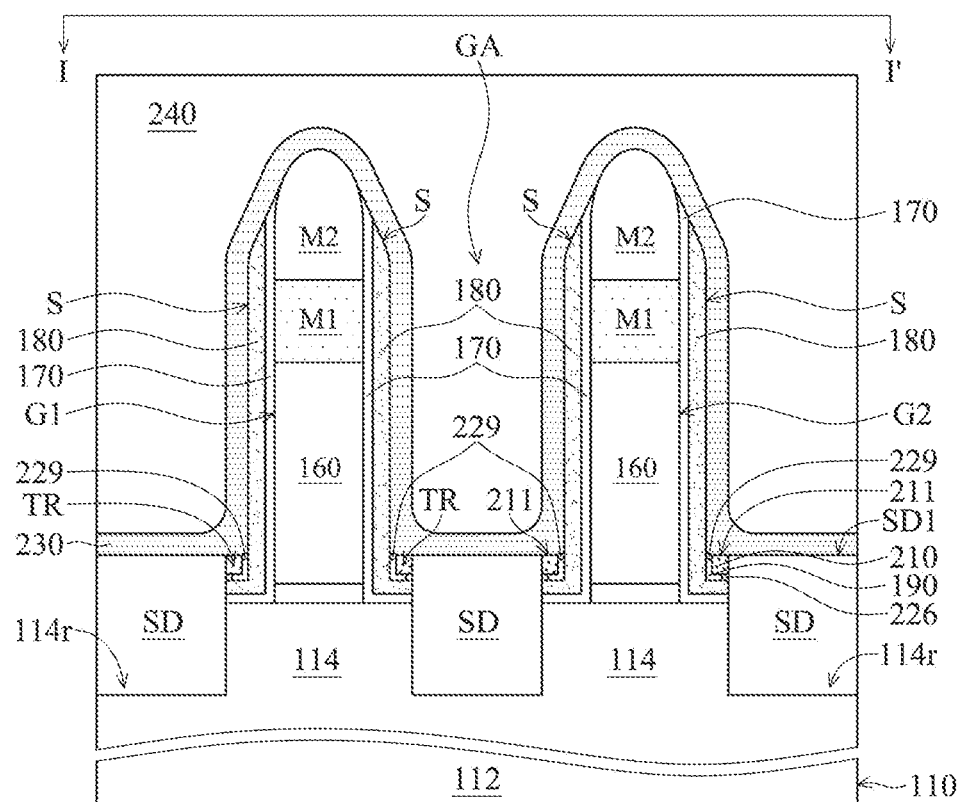
Figures 2, 2G:
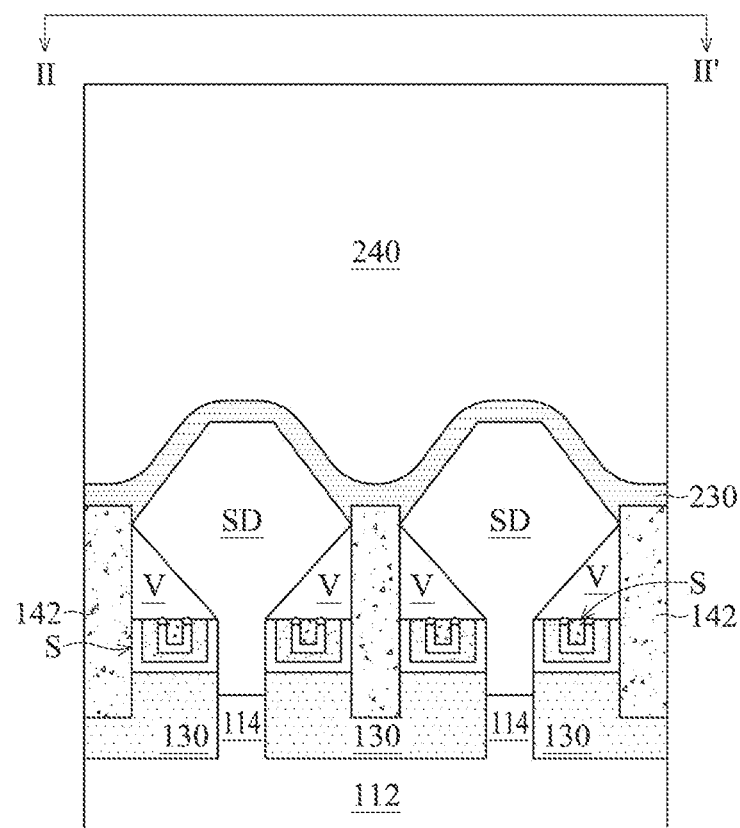
Figure 2H:
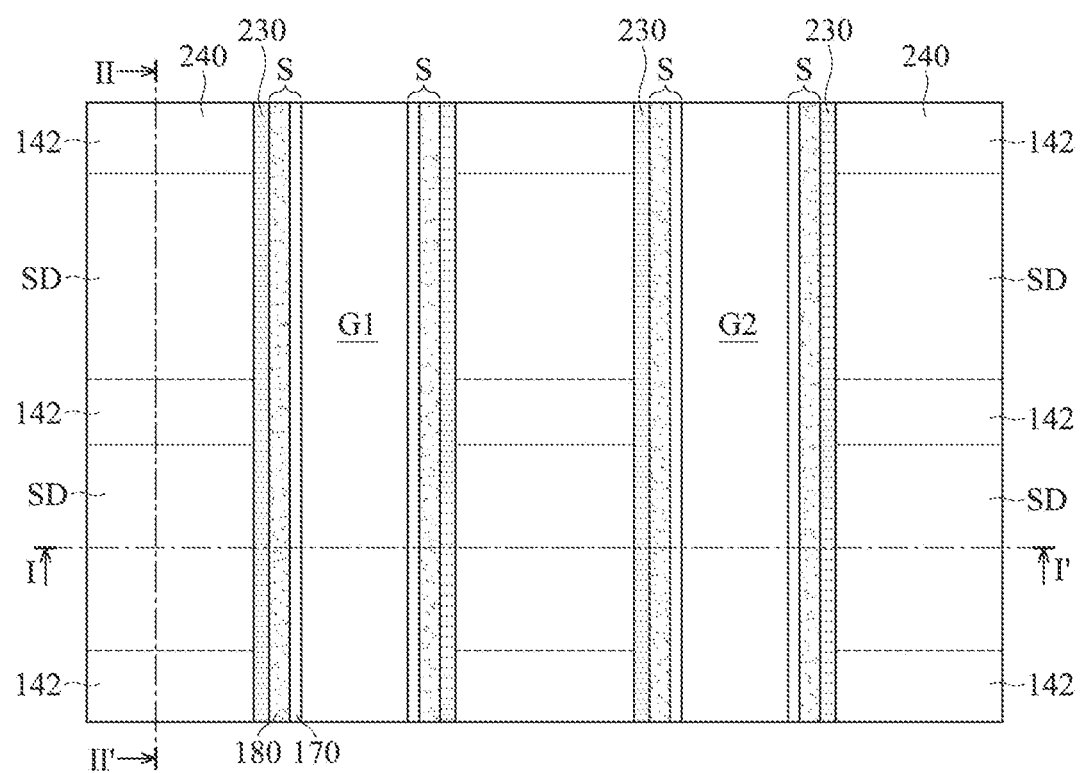
Figures 1, 2H:
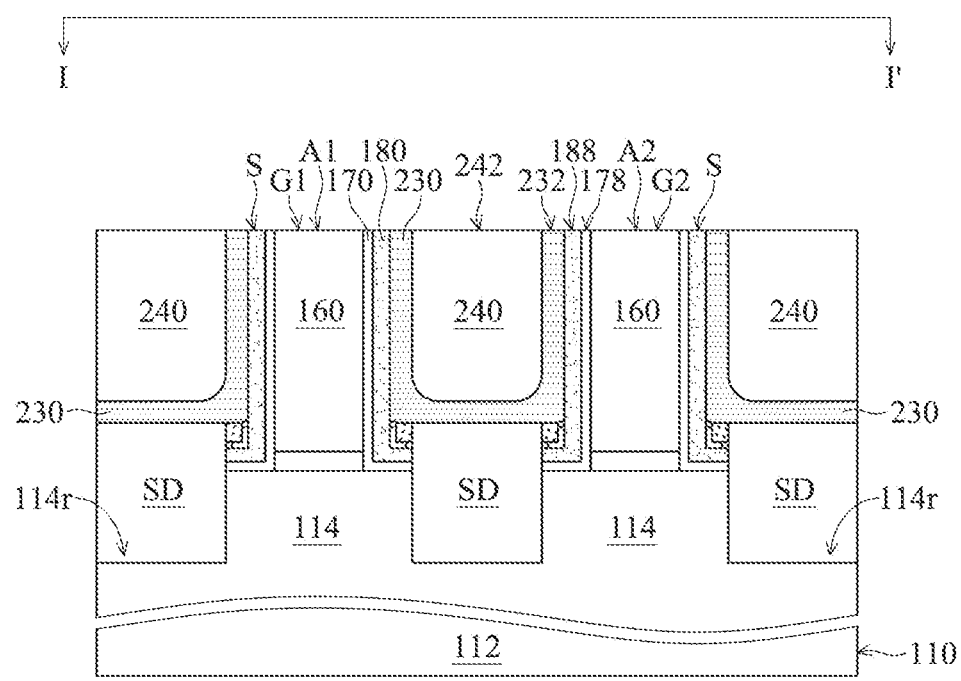
Figures 2, 2H:
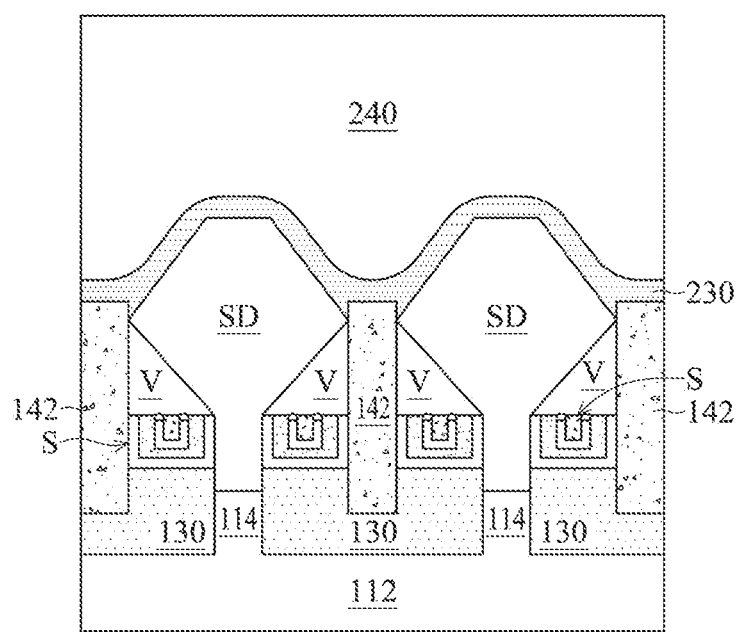
Figure 2I:
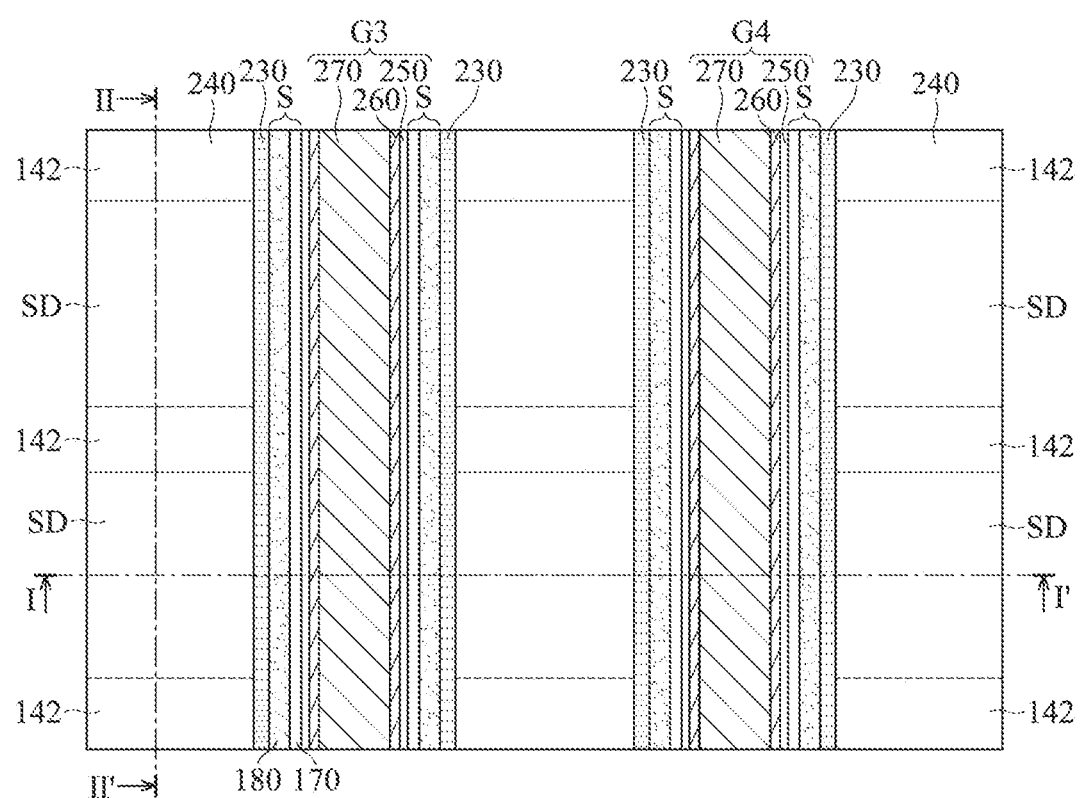
Figures 1, 2I:
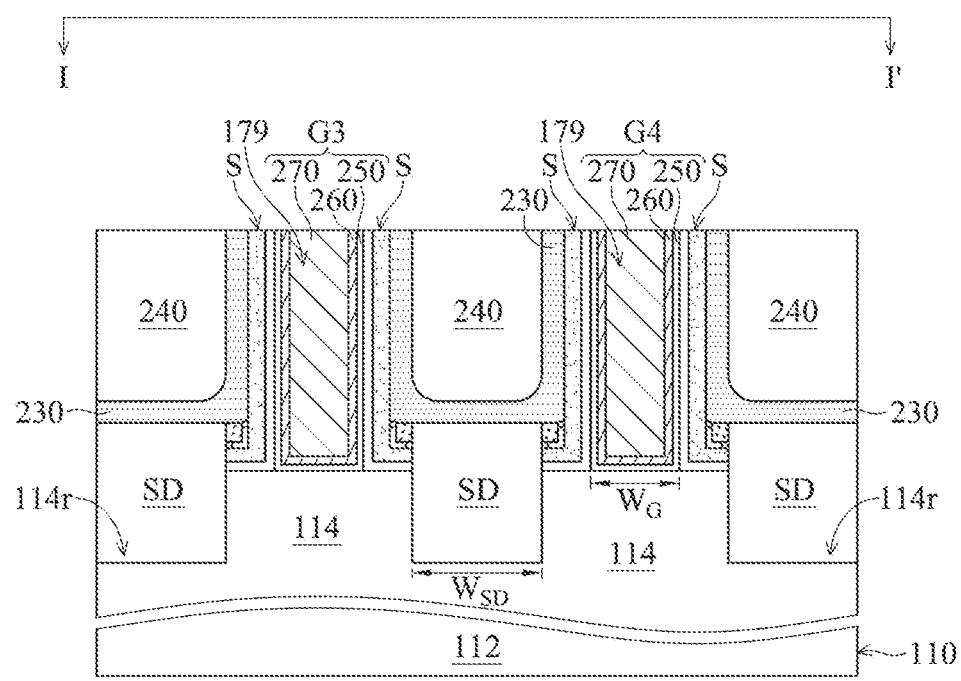
Figures 2, 2I:
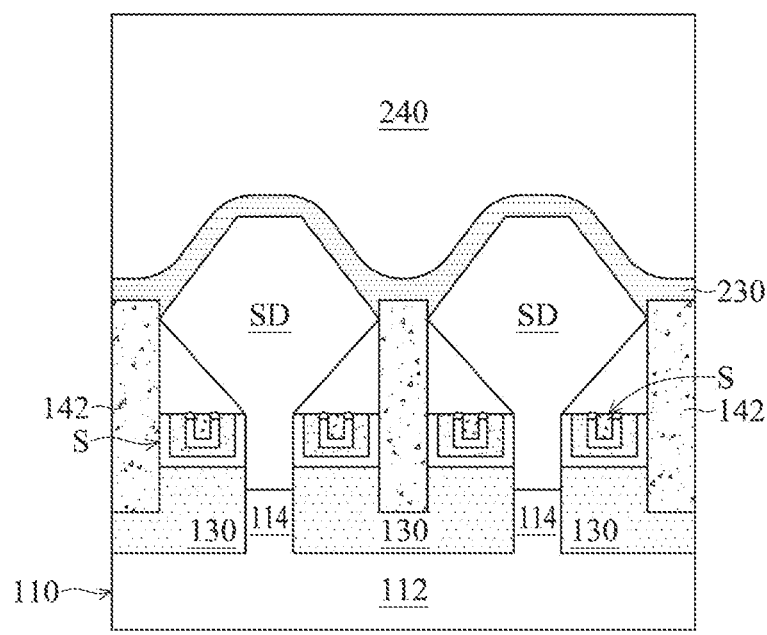
Figure 2J:
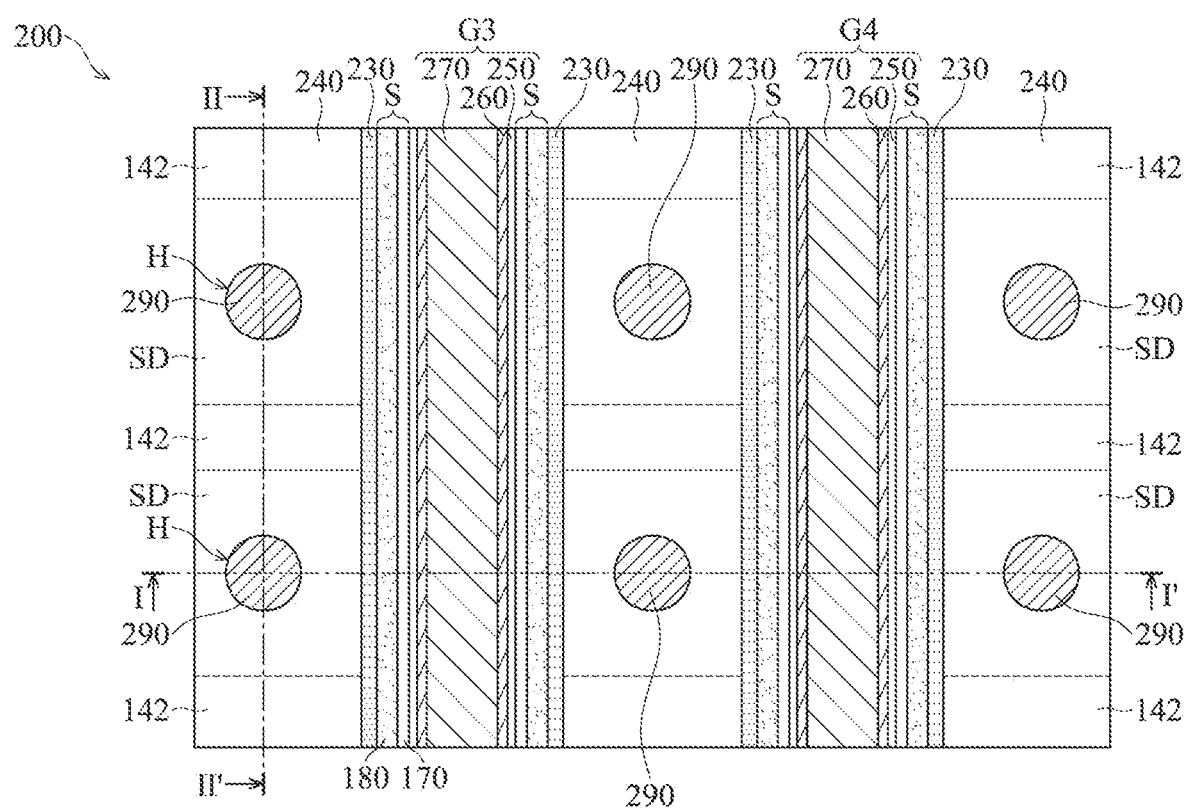
Figures 1, 2J:
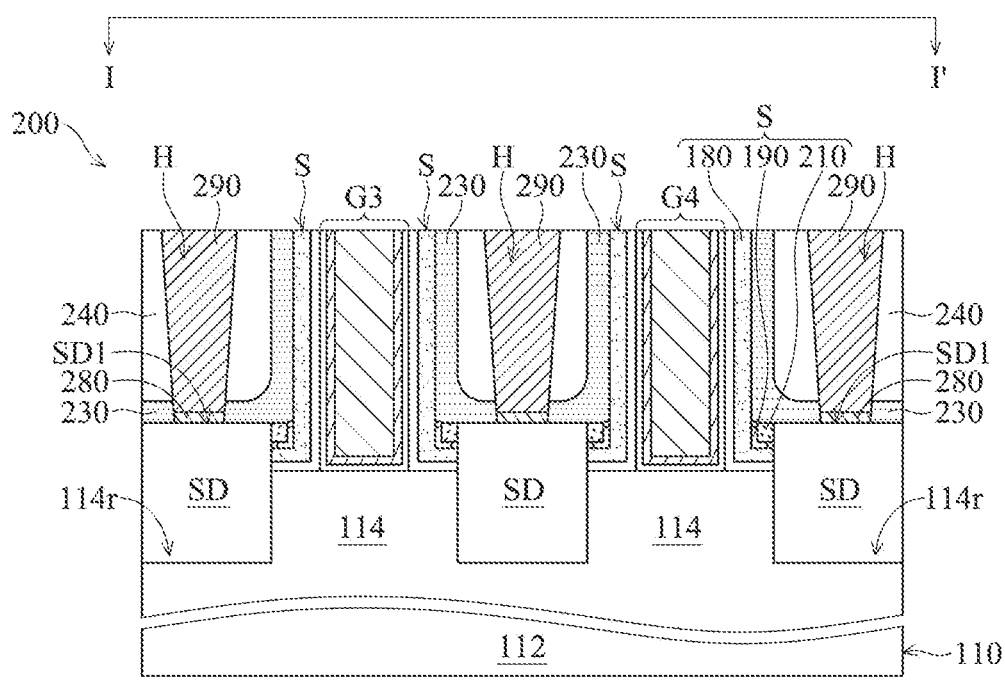
Figures 2, 2J:
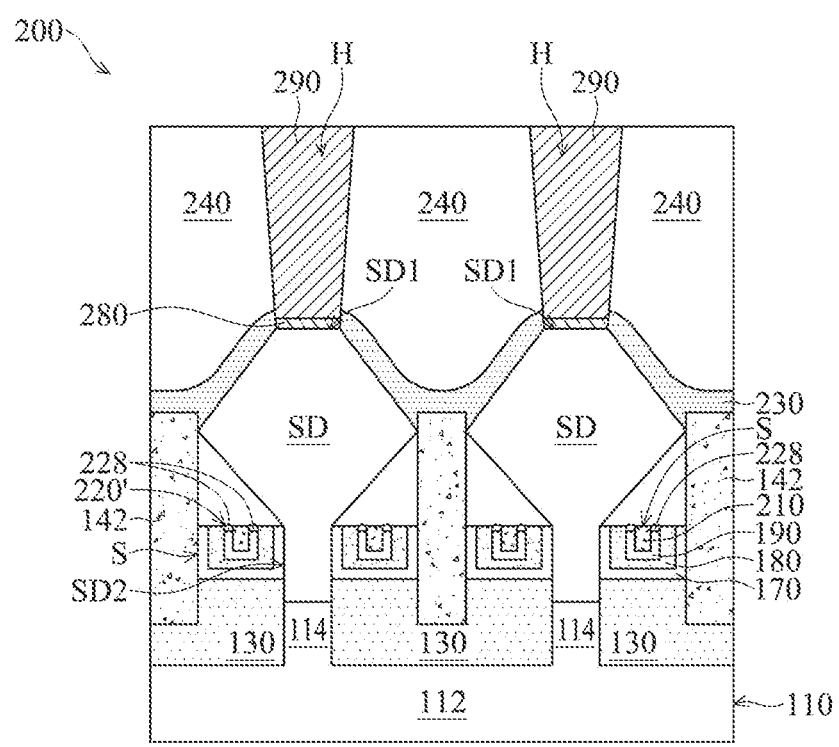

FIGS. 2A-2J are top views of various stages of a process for forming a semiconductor device structure, in accordance with some embodiments. FIGS. 2A-1 to 2J-1 are cross-sectional side views illustrating the semiconductor device structure along a sectional line I-I' in FIGS. 2A-2J, in accordance with some embodiments. FIGS. 2A-2 to 2J-2 are cross-sectional side views illustrating the semiconductor device structure along a sectional line II-II' in FIGS. 2A-2J, in accordance with some embodiments.

After the step of FIG. 2A, as shown in FIGS. 2B, 2B-1, and 2B-2, a dielectric layer 170 is formed over the gate stacks G1 and G2, the mask layers M1 and M2, and the substrate 110, in accordance with some embodiments. The dielectric layer 170 conformally covers sidewalls S1 and S2 of the gate stacks G1 and G2, the mask layers M1 and M2, and a top surface 116 of the substrate 110, in accordance with some embodiments.

The dielectric layer 170 has bottom portions 172, sidewall portions 174, and upper portions 176, in accordance with some embodiments. The bottom portions 172 are over the substrate 110, in accordance with some embodiments. The sidewall portions 174 cover the mask layer M1 and the sidewalls S1 and S2 of the gate stacks G1 and G2, in accordance with some embodiments. The upper portions 176 cover the mask layer M2, in accordance with some embodiments.

In some embodiments, the dielectric layer 170 is made of an insulating material, such as oxide (e.g., silicon oxycarbonitride (SiCON) or silicon oxide), nitride (e.g., silicon nitride), carbide (e.g., silicon carbide), oxynitride (e.g., silicon oxynitride), or another applicable insulating material. In some embodiments, the insulating material includes a low dielectric constant (low-k) material. The low dielectric constant material has a dielectric constant, which is about 5.

The dielectric layer 170 is formed using a deposition process, such as a chemical vapor deposition (CVD) process, an atomic layer deposition (ALD) process, or a physical vapor deposition (PVD) process, in accordance with some embodiments.

As shown in FIGS. 2B, 2B-1, and 2B-2, a dielectric layer 180 is formed over the dielectric layer 170, in accordance with some embodiments. The dielectric layer 180 conformally covers an upper surface 171 of the dielectric layer 170, in accordance with some embodiments. In some embodiments, the density of the dielectric layer 170 is greater than that of the dielectric layer 180, which improves the anti-etching ability of the dielectric layer 170.

In some embodiments, the dielectric constant of the dielectric layer 180 is lower than that of the dielectric layer 170, and the dielectric layer 180 is thicker than the dielectric layer 170, which reduce the dielectric constant of a spacer structure including the dielectric layers 170 and 180 and therefore reduces RC (referring to a time constant that is a product of resistance and capacitance) delay, in accordance with some embodiments.

FIG. 2B-3 is an enlarged view of a region R of the semiconductor device structure of FIG. 2B-1, in accordance with some embodiments. As shown in FIG. 2B-3, the thickness T170 of the dielectric layer 170 is less than the thickness T180 of the dielectric layer 180, in accordance with some embodiments.

The dielectric layer 180 has bottom portions 182, sidewall portions 184, and upper portions 186, in accordance with some embodiments. The bottom portions 182 are disposed over the bottom portions 172 of the dielectric layer 170, in accordance with some embodiments. The sidewall portions 184 are disposed over the sidewall portions 174 of the dielectric layer 170, in accordance with some embodiments. The upper portions 186 are disposed over the upper portions 176 of the dielectric layer 170, in accordance with some embodiments.

As shown in FIG. 2B-2, since the dielectric layer 180 conformally covers the upper surface 171 of the dielectric layer 170, the dielectric layer 180 has trenches 183, in accordance with some embodiments. Each trench 183 is located between the corresponding dielectric fin 142 and the corresponding fin portion 114, in accordance with some embodiments.

In some embodiments, the dielectric layer 180 is made of an insulating material, such as oxide (e.g., silicon oxycarbonitride (SiCON) or silicon oxide), nitride (e.g., silicon nitride), carbide (e.g., silicon carbide), oxynitride (e.g., silicon oxynitride), or another applicable insulating material. In some embodiments, the insulating material includes a low dielectric constant (low-k) material. The low dielectric constant material has a dielectric constant, which is lower than 5, in accordance with some embodiments.

The dielectric layer 180 is formed using a deposition process, such as a chemical vapor deposition (CVD) process, an atomic layer deposition (ALD) process, or a physical vapor deposition (PVD) process, in accordance with some embodiments.

As shown in FIGS. 2B, 2B-1, and 2B-2, a silicon rich layer 190 is formed over the dielectric layer 180, in accordance with some embodiments. The silicon rich layer 190 is used as an etch stop layer in the subsequent etching process, in accordance with some embodiments. The silicon rich layer 190 conformally covers an upper surface 181 of the dielectric layer 180, in accordance with some embodiments.

The silicon rich layer 190 has bottom portions 192, sidewall portions 194, and upper portions 196, in accordance with some embodiments. The bottom portions 192 are disposed over the bottom portions 182 of the dielectric layer 180, in accordance with some embodiments. The sidewall portions 194 are disposed over the sidewall portions 184 of the dielectric layer 180, in accordance with some embodiments. The upper portions 196 are disposed over the upper portions 186 of the dielectric layer 180, in accordance with some embodiments.

Since the silicon rich layer 190 is used as an etch stop layer in the subsequent etching process, the silicon rich layer 190 is able to prevent the bottom portions 182 of the dielectric layer 180 from being over-etched in the subsequent etching process, which improves the yield of the subsequent etching process, in accordance with some embodiments.

As shown in FIG. 2B-2, since the silicon rich layer 190 is used as an etch stop layer in the subsequent etching process, the silicon rich layer 190 in the trenches 183 is able to prevent the dielectric layer 180 under the trenches 183 from being over-etched in the subsequent etching process, which improves the yield of the subsequent etching process, in accordance with some embodiments.

As shown in FIG. 2B-3, the silicon rich layer 190 has a thickness T190, in accordance with some embodiments. The thickness T190 ranges from about 2.3 Å to about 12 Å, in accordance with some embodiments. The thickness T190 is less than the thickness T180 of the dielectric layer 180, in accordance with some embodiments.

The atomic percentage of silicon in the silicon rich layer 190 is greater than about 50%, in accordance with some embodiments. The atomic percentage of silicon in the silicon rich layer 190 ranges from about 51% to about 100%, in accordance with some embodiments. The atomic percentage of silicon in the silicon rich layer 190 ranges from about 60% to about 100%, in accordance with some embodiments. The atomic percentage of silicon in the silicon rich layer 190 ranges from about 80% to about 100%, in accordance with some other embodiments.

In some embodiments, as shown in FIG. 2B-1, the atomic percentage of silicon in the silicon rich layer 190 decreases from a lower surface 191*b* to an upper surface 191 of the silicon rich layer 190. The atomic percentage of silicon in the silicon rich layer 190 close to the lower surface 191*b* is about 100%, in accordance with some embodiments.

When the atomic percentage of silicon in the silicon rich layer 190 is about 100%, the silicon rich layer 190 is also referred to as a semiconductor layer or a silicon layer, in accordance with some embodiments. In some embodiments, the silicon rich layer 190 is made of silicon.

In some other embodiments, the silicon rich layer 190 is made of a silicon rich material, such as silicon rich nitride. The atomic percentage of silicon in silicon rich nitride is greater than the atomic percentage of nitrogen in silicon rich nitride, in accordance with some embodiments.

The silicon rich layer 190 is formed using a deposition process, such as an atomic layer deposition process, a chemical vapor deposition process, or a physical vapor deposition process, in accordance with some embodiments.

In some embodiments, the silicon rich layer 190 is made of silicon and formed using the atomic layer deposition process, the dielectric layer 180 is soaked in a silicon containing precursor gas, such as silane or $SiH_2Cl_2$, during the atomic layer deposition process.

In some embodiments, the silicon rich layer 190 is made of silicon rich nitride and formed using the atomic layer deposition process, the upper surface 181 of the dielectric layer 180 is alternatively reacted with a silicon-containing precursor gas and a nitrogen-containing precursor gas in the same process chamber. The nitrogen containing precursor gas includes ammonia ($NH_3$), in accordance with some embodiments.

During the atomic layer deposition process, the number of times the upper surface 181 is reacted with the silicon-containing precursor gas is greater than the number of times the upper surface 181 is reacted with the nitrogen-containing precursor gas, in accordance with some embodiments. Therefore, the silicon rich layer 190 has a first number of monoatomic silicon layers and a second number of monoatomic nitrogen layers, and the first number is greater than the second number, in accordance with some embodiments.

As shown in FIGS. 2B, 2B-1, and 2B-2, a protection layer 210 is formed over the silicon rich layer 190, in accordance with some embodiments. The protection layer 210 conformally covers the upper surface 191 of the silicon rich layer 190, in accordance with some embodiments.

The silicon rich layer 190 is disposed between the dielectric layer 180 and the protection layer 210, in accordance with some embodiments. The silicon rich layer 190 separates the dielectric layer 180 from the protection layer 210, in accordance with some embodiments.

The protection layer 210 has bottom portions 212, sidewall portions 214, and upper portions 216, in accordance with some embodiments. The bottom portions 212 are disposed over the bottom portions 192 of the silicon rich layer 190, in accordance with some embodiments. The sidewall portions 214 are disposed over the sidewall portions 194 of the silicon rich layer 190, in accordance with some embodiments. The upper portions 216 are disposed over the upper portions 196 of the silicon rich layer 190, in accordance with some embodiments.

As shown in FIGS. 2B-1 and 2B-3, the thickness T210 of the protection layer 210 is greater than the thickness T190 of the silicon rich layer 190, in accordance with some embodiments. In some embodiments, a ratio of the thickness T210 to the thickness T190 ranges from about 4:1 to about 12:1.

As shown in FIGS. 2B-1 and 2B-3, the thicknesses T210, T190, T180, and T170 are measured in a direction A1, in accordance with some embodiments. The direction A1 is perpendicular to the sidewall S2 of the gate stack G2 or the sidewall S1 of the gate stack G1, in accordance with some embodiments.

The protection layer 210 and the silicon rich layer 190 are made of different materials with different compositions, which improves the etching selectivity of the protection layer 210 to the silicon rich layer 190, in accordance with some embodiments. The etching selectivity of the protection layer 210 to the silicon rich layer 190 ranges from about 4 to about 7, in accordance with some embodiments.

The protection layer 210 is made of a dielectric material, such as nitride (e.g., silicon nitride), carbide (e.g., silicon carbide), or oxynitride (e.g., silicon oxynitride), in accordance with some embodiments. The protection layer 210 is formed using a deposition process, such as an atomic layer deposition process, a chemical vapor deposition process, or a physical vapor deposition process, in accordance with some embodiments.

In some embodiments, the protection layer 210 and the silicon rich layer 190 are formed in the same chamber, such as an atomic layer deposition chamber. That is, the protection layer 210 and the silicon rich layer 190 are formed in situ, in accordance with some embodiments. The protection layer 210 and the silicon rich layer 190 are formed using atomic layer deposition processes, in accordance with some embodiments.

In some embodiments, the protection layer 210 is made of silicon nitride ($Si_3N_4$), and the atomic percentage of silicon in silicon nitride is close to 43%. In some embodiments, the atomic percentage of silicon in the silicon rich layer 190 close to the upper surface 191 (or the protection layer 210) is about 43%.

In some embodiments, the atomic percentage of silicon in the silicon rich layer 190 decreases toward the protection layer 210 and becomes similar to the atomic percentage of silicon in the protection layer 210. Therefore, the lattice structure of the silicon rich layer 190 close to the protection layer 210 is similar to the lattice structure of the protection layer 210, which improves the adhesion between the silicon rich layer 190 and the protection layer 210, in accordance with some embodiments.

As shown in FIGS. 2C, 2C-1, and 2C-2, the top portions 216 and the bottom portions 212 of the protection layer 210 are partially removed, in accordance with some embodiments. After the removal process, the protection layer 210 covers the sidewall portions 194 and exposes the bottom portion 192 and the upper portions 196 of the silicon rich layer 190, in accordance with some embodiments. The sidewall portions 214 of the protection layer 210 are spaced apart from each other, in accordance with some embodiments. The silicon rich layer 190 is connected between the sidewall portions 214, in accordance with some embodiments.

As shown in FIGS. 2C, 2C-1, and 2C-2, after the removal process, an oxide layer 220 is formed over the exposed portions of the silicon rich layer 190 exposed by the protection layer 210, in accordance with some embodiments. The oxide layer 220 is in direct contact with the silicon rich layer 190, in accordance with some embodiments.

The oxide layer 220 has portions 222 and 223, in accordance with some embodiments. The portion 222 is located between the sidewall portions 214 of the protection layer 210, in accordance with some embodiments. The portion 222 is connected to the sidewall portions 214 of the protection layer 210, in accordance with some embodiments.

The portions 222 cover the bottom portions 192 of the silicon rich layer 190, in accordance with some embodiments. The portion 222 is partially embedded in the silicon rich layer 190, in accordance with some embodiments. The portion 222 has an upper surface 222a and a lower surface 222b, in accordance with some embodiments. The upper surface 222a is higher than the upper surface 192a of the bottom portion 192 of the silicon rich layer 190, in accordance with some embodiments. The lower surface 222b is lower than the upper surface 192a, in accordance with some embodiments.

The bottom portion 192 of the silicon rich layer 190 is partially between the portion 222 of the oxide layer 220 and the bottom portion 182 of the dielectric layer 180, in accordance with some embodiments. The thickness T220 of the oxide layer 220 ranges from about 4 Å to about 12 Å, in accordance with some embodiments. The portions 223 cover top surfaces 196a of the upper portions 196 of the silicon rich layer 190, in accordance with some embodiments.

The oxide layer 220 is formed by oxidation of the surface part of the silicon rich layer 190 exposed by the protection layer 210, and therefore the oxide layer 220 and the silicon rich layer 190 have the same semiconductor element, in accordance with some embodiments. The semiconductor element includes silicon, in accordance with some embodiments. The oxide layer 220 is made of silicon oxide or silicon oxide nitride, in accordance with some embodiments.

The removal process includes an etching process, in accordance with some embodiments. The etching process includes an anisotropic etching process, such as a dry etching process (e.g., a plasma etching process), in accordance with some embodiments.

The etching process uses an etching gas including oxygen, carbon, hydrogen, and fluorine, in accordance with some embodiments. When the protection layer 210 is etched through and therefore exposes the silicon rich layer 190 thereunder, the exposed surface part of the silicon rich layer 190 is oxidized to form the oxide layer 220, in accordance with some embodiments. Since volume expansion due to the oxidation occurs, the volume of the oxide layer 220 is greater than the volume of the oxidized surface part, in accordance with some embodiments.

In some embodiments, an etching rate of the oxide layer 220 is lower than an etching rate of the protection layer 210 in the etching process. The etching selectivity of silicon nitride to silicon oxide (or silicon oxide nitride) is about 4 to about 7, in accordance with some embodiments.

Since the etching selectivity of silicon nitride to silicon oxide (or silicon oxide nitride) is high, the etching process is stopped at the oxide layer 220, in accordance with some embodiments. Therefore, the formation of the oxide layer 220 prevents the corner portions 170c and 180c of the dielectric layers 170 and 180 from being etched, in accordance with some embodiments. Therefore, the yield of the etching process is improved, in accordance with some embodiments. The oxide layer 220 is also referred to as a buffer layer, in accordance with some embodiments.

As shown in FIGS. 2D, 2D-1, and 2D-2, the oxide layer 220 and the top portions 196, 186 and 176 and the bottom portions 192, 182, and 172 of the silicon rich layer 190, the dielectric layer 180, and the dielectric layer 170 are partially removed, in accordance with some embodiments.

As shown in FIG. 2D-2, after the removal process, the remaining silicon rich layer 190 is embedded in the remaining dielectric layer 180, in accordance with some embodiments. The remaining protection layer 210 is embedded in the remaining silicon rich layer 190, in accordance with some embodiments.

The removal process includes an etching process, in accordance with some embodiments. The etching process includes an anisotropic etching process, such as a dry etching process (e.g., a plasma etching process), in accordance with some embodiments.

As shown in FIGS. 2D, 2D-1, and 2D-2, an oxide layer 220' is formed over the exposed portions of the silicon rich layer 190 exposed by the protection layer 210, in accordance with some embodiments. The oxide layer 220' is in direct contact with the silicon rich layer 190, in accordance with some embodiments.

The oxide layer 220' has portions 224, 226 and 228, in accordance with some embodiments. The portions 224 cover top surfaces 194a of the sidewall portions 194 of the silicon rich layer 190, in accordance with some embodiments. The portion 224 has a sloped upper surface 224a, in accordance with some embodiments.

The sloped upper surface 224a is a convex curved surface, in accordance with some embodiments. The sloped upper surface 224a protrudes from the upper surfaces 184a of the sidewall portions 184 and 214 of the dielectric layer 180 and the protection layer 210, in accordance with some embodiments.

The portions 226 of the oxide layer 220' cover sidewalls 192b of the bottom portions 192 of the silicon rich layer 190, in accordance with some embodiments. The portion 226 has a sidewall 226a, in accordance with some embodiments. The sidewall 226a is substantially vertical to the top surface 114a of the fin portion 114, in accordance with some embodiments.

The sidewall 226a is a convex curved surface, in accordance with some embodiments. The sidewall 226a protrudes from the sidewalls 182a and 214a of the bottom portions 182 and the sidewall portions 214 of the dielectric layer 180 and the protection layer 210, in accordance with some embodiments.

As shown in FIG. 2D-2, the portions 228 of the oxide layer 220' cover the upper surface 191 of the silicon rich layer 190 between the dielectric fins 142 and the fin portions 114, in accordance with some embodiments. The portion 228 has an upper surface 228a, in accordance with some embodiments. The upper surface 228a is a convex curved surface, in accordance with some embodiments. The upper surface 228a protrudes from the upper surfaces 181 and 211 of the dielectric layer 180 and the protection layer 210, in accordance with some embodiments.

The remaining protection layer 210, the remaining silicon rich layer 190, the remaining dielectric layer 180, the remaining dielectric layer 170, and the oxide layer 220' together form a spacer structure S, in accordance with some embodiments. The spacer structure S remains over the sidewalls S1 and S2 of the gate stacks G1 and G2 and opposite sidewalls of the mask layers M1 and M2, in accordance with some embodiments. In some embodiments, the spacer structure S surrounds the gate stacks G1 and G2.

As shown in FIG. 2D-2, a height H1 of the spacer structure S is less than a height H2 of the dielectric fin 142 relative to the top surface 134 of the isolation layer 130, in accordance with some embodiments. In some embodiments, a ratio of the height H1 to the height H2 ranges from about 0.2:1 to about 0.4:1.

Afterwards, as shown in FIGS. 2E, 2E-1, and 2E-2, the fin portions 114 exposed by the gate stacks G1 and G2 and the spacer structure S are partially removed to form recesses 114r in the fin portions 114, in accordance with some embodiments. The removal process includes an etching process, such as a dry etching process or a wet etching process, in accordance with some embodiments.

As shown in FIGS. 2F, 2F-1, and 2F-2, source/drain structures SD (which may be referred to as a region that may be a source region or a drain region in some embodiments) are respectively formed in the recesses 114r of the fin portions 114, in accordance with some embodiments. The portions 226 of the oxide layer 220' are in direct contact with the source/drain structures SD, in accordance with some embodiments. In some embodiments, as shown in FIG. 2F-2, the spacer structure S is over sidewalls SD2 of the source/drain structures SD, in accordance with some embodiments. In some embodiments, as shown in FIG. 2F-2, voids V are formed.

Each void V is surrounded by the corresponding source/drain structure SD, the spacer structure S, and the corresponding dielectric fin 142, in accordance with some embodiments. The voids V are substantially closed, in accordance with some embodiments. The source/drain structure SD is located between two adjacent voids V, in accordance with some embodiments.

In some embodiments, the source/drain structures SD are made of a semiconductor material (e.g., silicon germanium), in accordance with some embodiments. The source/drain structures SD may have P-type dopants, such as the Group IIIA element. The Group IIIA element includes boron or another suitable material.

In some other embodiments, the source/drain structures SD are made of a semiconductor material (e.g., silicon), in accordance with some embodiments. The source/drain structures SD may have N-type dopants, such as the Group VA element. The Group VA element includes phosphor (P), antimony (Sb), or another suitable Group VA material. The source/drain structures SD are formed using an epitaxial process, in accordance with some embodiments.

As shown in FIG. 2F-2, the spacer structure S is located between the corresponding source/drain structure SD and the corresponding dielectric fin 142, in accordance with some embodiments. The source/drain structure SD is located between two adjacent dielectric fins 142, in accordance with some embodiments. The source/drain structure SD is in direct contact with the two adjacent dielectric fins 142, in accordance with some embodiments. The dielectric fins 142 are used to limit the maximum width of the source/drain structure SD therebetween, in accordance with some embodiments.

As shown in FIGS. 2G, 2G-1, and 2G-2, the portions 224 of the oxide layer 220' and upper portions of the silicon rich layer 190 and the protection layer 210 outside of the trenches TR between the source/drain structures SD and the dielectric layer 180 are removed, in accordance with some embodiments.

The removal process is able to reduce the aspect ratio of the gap GA, in accordance with some embodiments. Since the dielectric constants of the silicon rich layer 190 and the protection layer 210 are greater than that of the dielectric layers 170 and 180, the removal process is able to reduce the overall dielectric constant of the spacer structure S and therefore reduces RC delay, in accordance with some embodiments.

After the removal process, lower portions of the silicon rich layer 190 and the protection layer 210 remain in the trenches TR between the source/drain structures SD and the dielectric layer 180, in accordance with some embodiments. The upper surface 211 of the protection layer 210 is substantially level with the upper surface SD1 of the source/drain structure SD, in accordance with some embodiments.

As shown in FIGS. 2G and 2G-1, an oxide layer 229 is formed over the silicon rich layer 190, in accordance with some embodiments. The oxide layer 229 is formed by oxidation of the exposed surface part of the silicon rich layer 190, and therefore the oxide layer 229 and the silicon rich layer 190 have the same semiconductor element, in accordance with some embodiments.

The semiconductor element includes silicon, in accordance with some embodiments. The oxide layer 229 is made of silicon oxide or silicon oxide nitride, in accordance with some embodiments. The removal process includes an etching process such as a wet etching process or a dry etching process, in accordance with some embodiments.

As shown in FIGS. 2G-1 and 2G-2, an etch stop layer 230 is conformally formed over the source/drain structure SD, the dielectric fins 142, the spacer structure S, and the mask layer M2, in accordance with some embodiments. The etch stop layer 230 is made of an insulating material, such as a nitrogen-containing material (e.g., silicon nitride), in accordance with some embodiments.

The etch stop layer 230 is formed using a deposition process, such as a chemical vapor deposition (CVD) process, an atomic layer deposition (ALD) process, or a physical vapor deposition (PVD) process, in accordance with some embodiments.

As shown in FIGS. 2G, 2G-1, and 2G-2, a dielectric layer 240 is formed over the etch stop layer 230, in accordance with some embodiments. The dielectric layer 240 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The dielectric layer 240 is deposited by any suitable process, such as a CVD process, a spin-on process, a sputtering process, or a combination thereof, in accordance with some embodiments.

Afterwards, as shown in FIGS. 2H, 2H-1, and 2H-2, the mask layers M1 and M2 and upper portions of the dielectric layer 240, the etch stop layer 230, the spacer structure S, and the gate stacks G1 and G2 are removed, in accordance with some embodiments.

After the removal process, top surfaces A1, A2, 178, 188, 232, and 242 of the gate stacks G1 and G2, the dielectric layer 170, the dielectric layer 180, the etch stop layer 230, and the dielectric layer 240 are substantially level with each other or substantially coplanar with each other, in accordance with some embodiments.

Thereafter, a gate replacement process is performed, in accordance with some embodiments. As shown in FIGS. 2H, 2I, and 2I-1, the gate stacks G1 and G2 are removed, in accordance with some embodiments. The spacer structure S has trenches 179, in accordance with some embodiments. The trenches 179 expose the dielectric fins 142 and the fin portions 114, and in accordance with some embodiments.

As shown in FIGS. 2I, 2I-1, and 2I-2, gate stacks G3 and G4 are formed in the trenches 179, in accordance with some embodiments. In some embodiments, a ratio of the width $W_{SD}$ of the source/drain structure SD to the width $W_G$ of the gate stack G3 or G4 ranges from about 1 to about 2. Each of the gate stacks G3 and G4 includes a gate dielectric layer 250, a work function metal layer 260, and a gate electrode layer 270, in accordance with some embodiments. The gate dielectric layer 250 is conformally formed in the trenches 179, in accordance with some embodiments.

The gate dielectric layer 250 is made of a dielectric material, such as a high dielectric constant (high-k) material, in accordance with some embodiments. The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

The work function metal layer 260 is conformally formed over the gate dielectric layer 250, in accordance with some embodiments. The work function metal layer 260 provides a desired work function for transistors to enhance device performance including improved threshold voltage. In the embodiments of forming an NMOS transistor, the work function metal layer 260 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 260 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or combinations thereof. The work function metal layer 260 may also be made of hafnium, zirconium, titanium, tantalum, aluminum, metal carbides (e.g., hafnium carbide or zirconium carbide), aluminides, ruthenium or a combination thereof.

The gate electrode layer 270 is formed over the work function metal layer 260, in accordance with some embodiments. The gate electrode layer 270 is also called a metal gate electrode layer, in accordance with some embodiments. The gate electrode layer 270 is made of a suitable metal material, such as aluminum, tungsten, gold, platinum, cobalt, other suitable metal, an alloy thereof, or a combination thereof, in accordance with some embodiments.

Thereafter, as shown in FIGS. 2J, 2J-1, and 2J-2, portions of the dielectric layer 240 and the etch stop layer 230 are removed to form contact holes H in the dielectric layer 240 and the etch stop layer 230, in accordance with some embodiments. The contact holes H pass though the dielectric layer 240 and the etch stop layer 230, in accordance with some embodiments. The contact hole H partially exposes the upper surface SD1 of the source/drain structure SD thereunder, in accordance with some embodiments.

Afterwards, a metal layer (not shown) is formed over the source/drain structure SD, in accordance with some embodiments. The metal layer is made of Ti, Co, Ru, or another suitable metal material. The metal layer is formed using a deposition process, such as a physical vapor deposition process, a plating process, another suitable method, or a combination thereof, in accordance with some embodiments.

Thereafter, as shown in FIGS. 2J-1 and 2J-2, the metal layer and the source/drain structures SD are annealed to react the metal layer with the source/drain structures SD so as to form a silicide layer 280 between the metal layer and the source/drain structures SD, in accordance with some embodiments. The silicide layer 280 is in direct contact with the source/drain structures SD, in accordance with some embodiments. The silicide layer 280 includes $TiSi_2$ (titanium disilicide), $CoSi_2$, or RuSi, in accordance with some embodiments.

As shown in FIGS. 2J-1 and 2J-2, portions of the metal layer that have not reacted with the source/drain structures SD are removed, in accordance with some embodiments. The removal process includes an etching process such as a wet etching process or a dry etching process, in accordance with some embodiments.

As shown in FIGS. 2J, 2J-1, and 2J-2, contact structures 290 are formed in the contact holes H, in accordance with some embodiments. The contact structures 290 pass through the dielectric layer 240 and the etch stop layer 230 to connect to the silicide layer 280 thereunder, in accordance with some embodiments.

The formation of the contact structures 290 includes depositing a conductive material layer (not shown) over the dielectric layer 240 and in the contact holes H; and performing a chemical mechanical polishing (CMP) process over the conductive material layer to remove the conductive material layer outside of the contact holes H, in accordance with some embodiments.

The contact structures 290 are made of tungsten (W) or another suitable conductive material, in accordance with some embodiments. In this step, a semiconductor device structure 200 is substantially formed, in accordance with some embodiments.

Figure 3A:
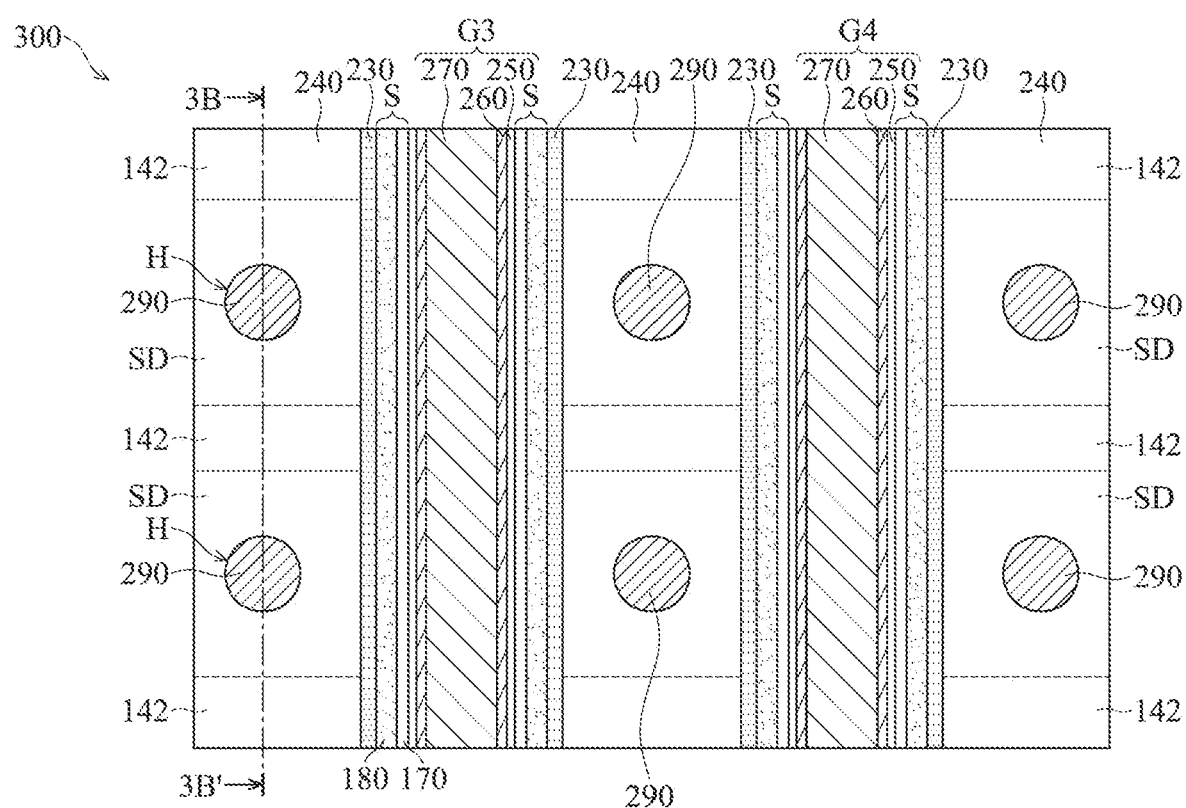
FIG. 3A is a top view of a semiconductor device structure, in accordance with some embodiments.
Figure 3B:
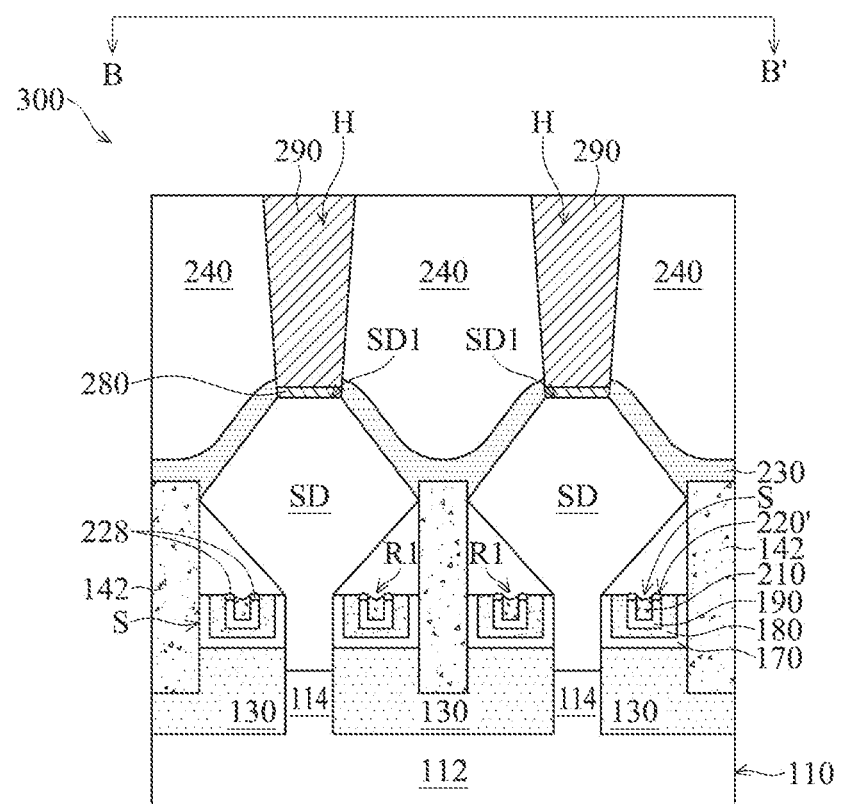
FIG. 3B is a cross-sectional side view illustrating the semiconductor device structure along a sectional line 3B-3B' in FIG. 3A, in accordance with some embodiments.

FIG. 3A is a top view of a semiconductor device structure 300, in accordance with some embodiments. FIG. 3B is a cross-sectional side view illustrating the semiconductor device structure 300 along a sectional line 3B-3B' in FIGS. 3A, in accordance with some embodiments.

As shown in FIGS. 3A and 3B, the semiconductor device structure 300 is similar to the semiconductor device structure 200 of FIG. 2J-2, except that the spacer structure S of the semiconductor device structure 300 has recesses R1 between the dielectric fins 142 and the source/drain structures SD, in accordance with some embodiments.

In some embodiments, the protection layer 210 is made of nitride, and the dielectric layers 170 and 180 are made of oxide. Since the etching rate of nitride is greater than the etching rate of oxide in the etching process, the recesses R1 may be formed in the protection layer 210 after the etching process of FIG. 2D-2.

Figure 4A:
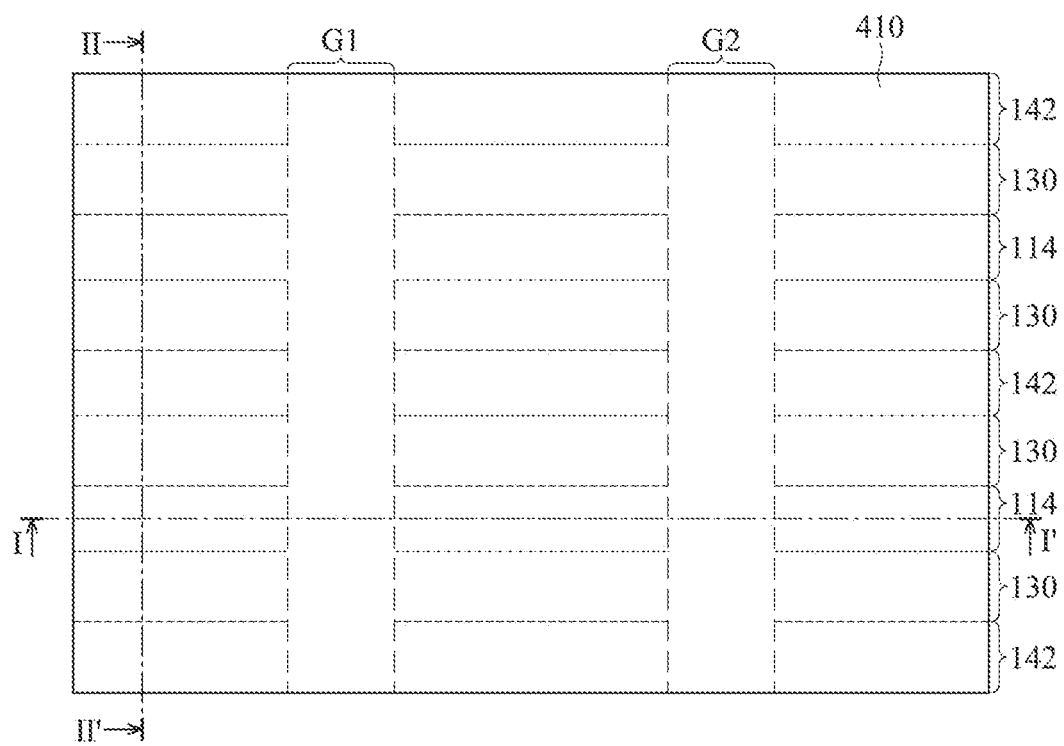
FIGS. 4A-4D are top views of various stages of a process for forming a semiconductor device structure, in accordance with some embodiments.
Figures 1, 4A:
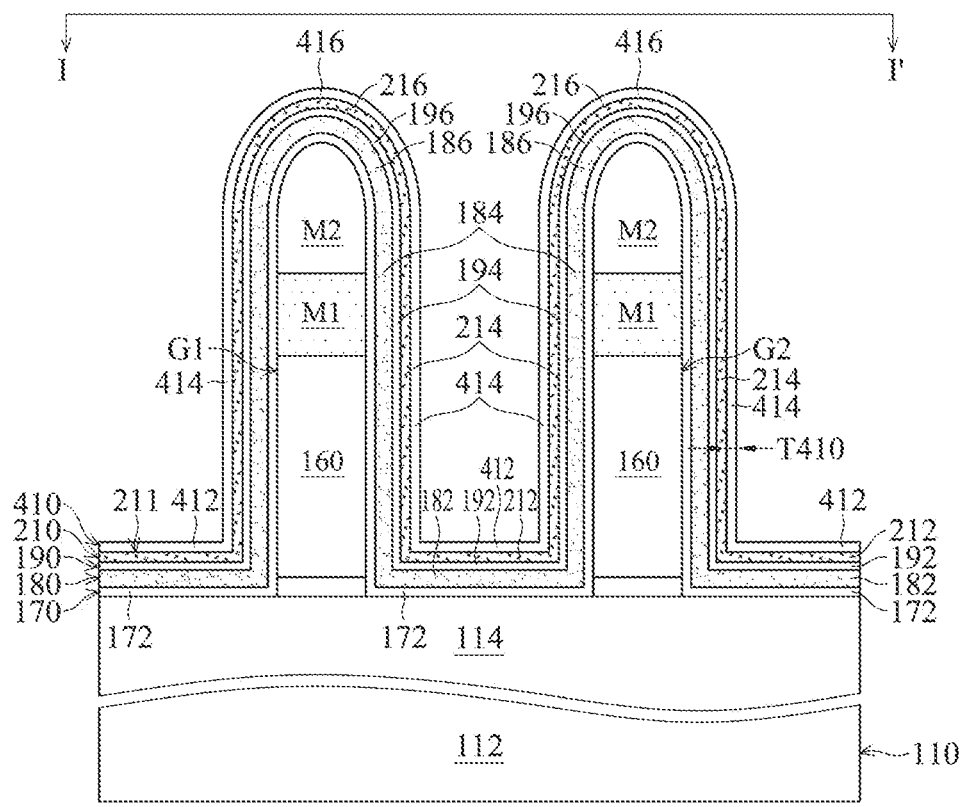
Figures 2, 4A:
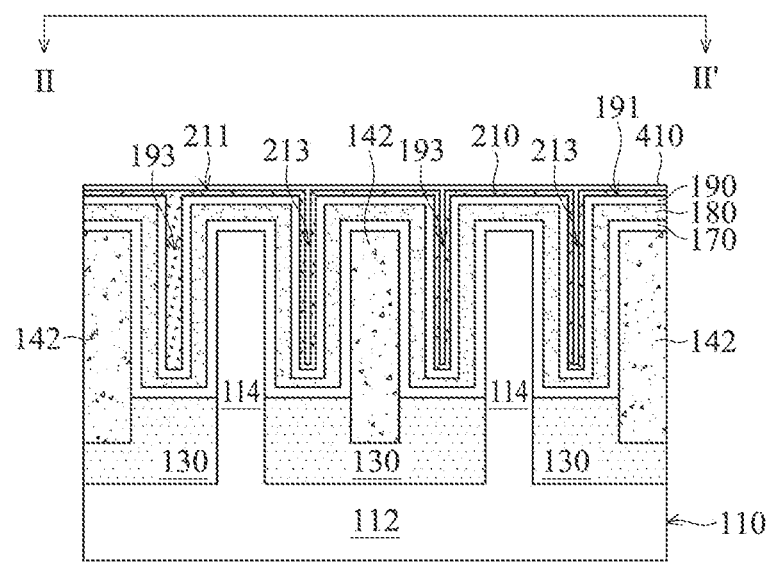
Figure 4B:
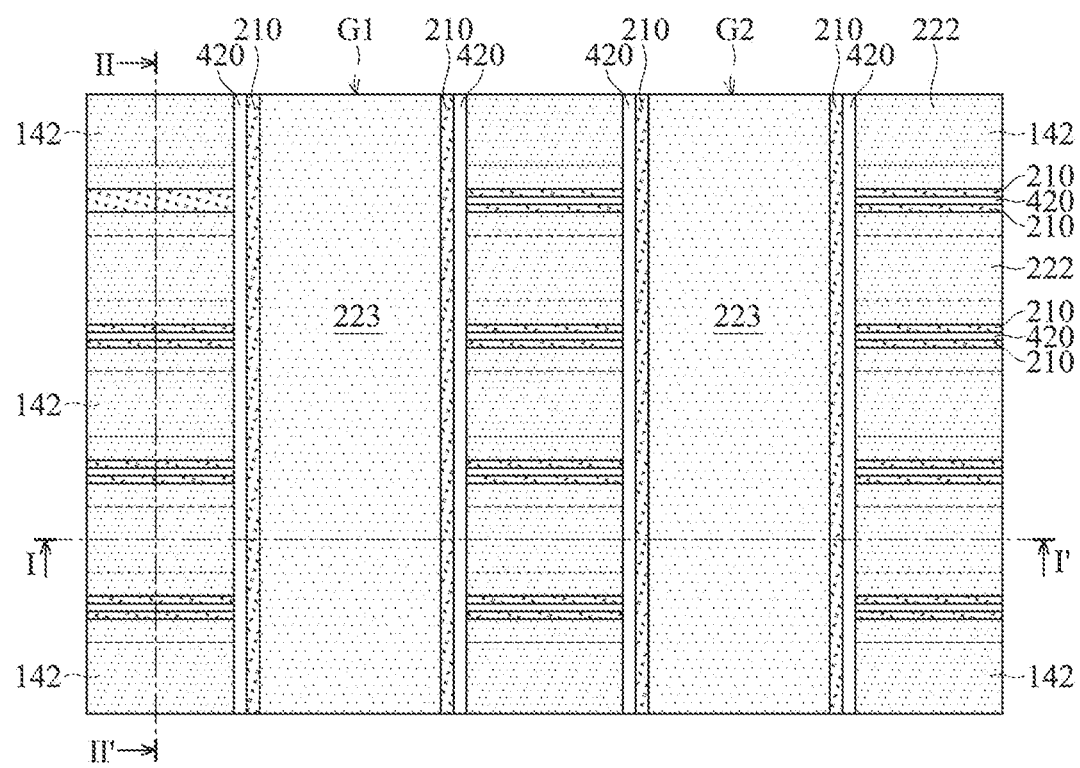
Figures 1, 4B:
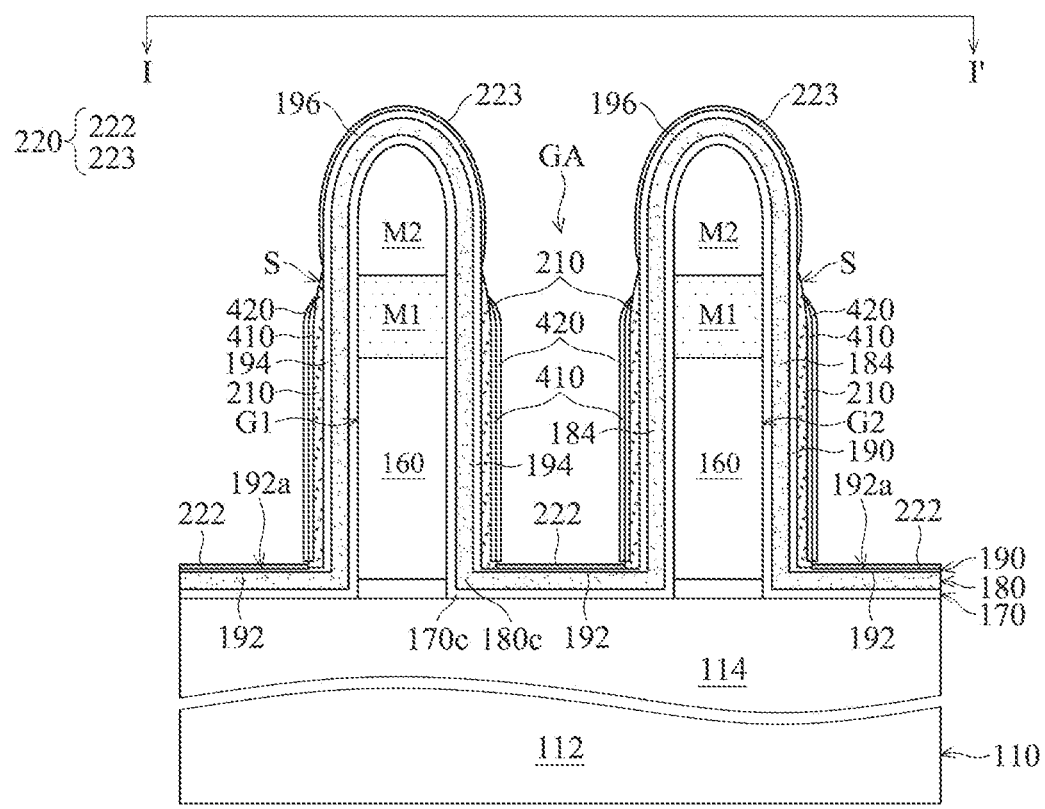
Figures 2, 4B:
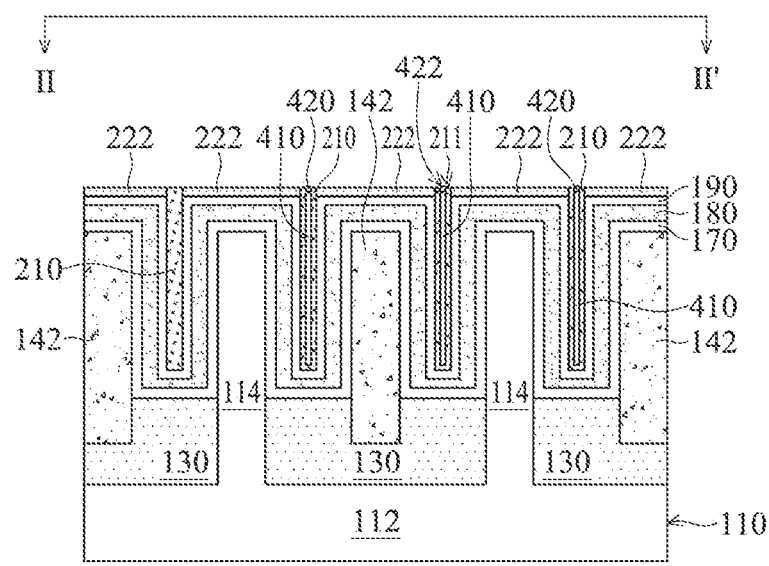
Figure 4C:
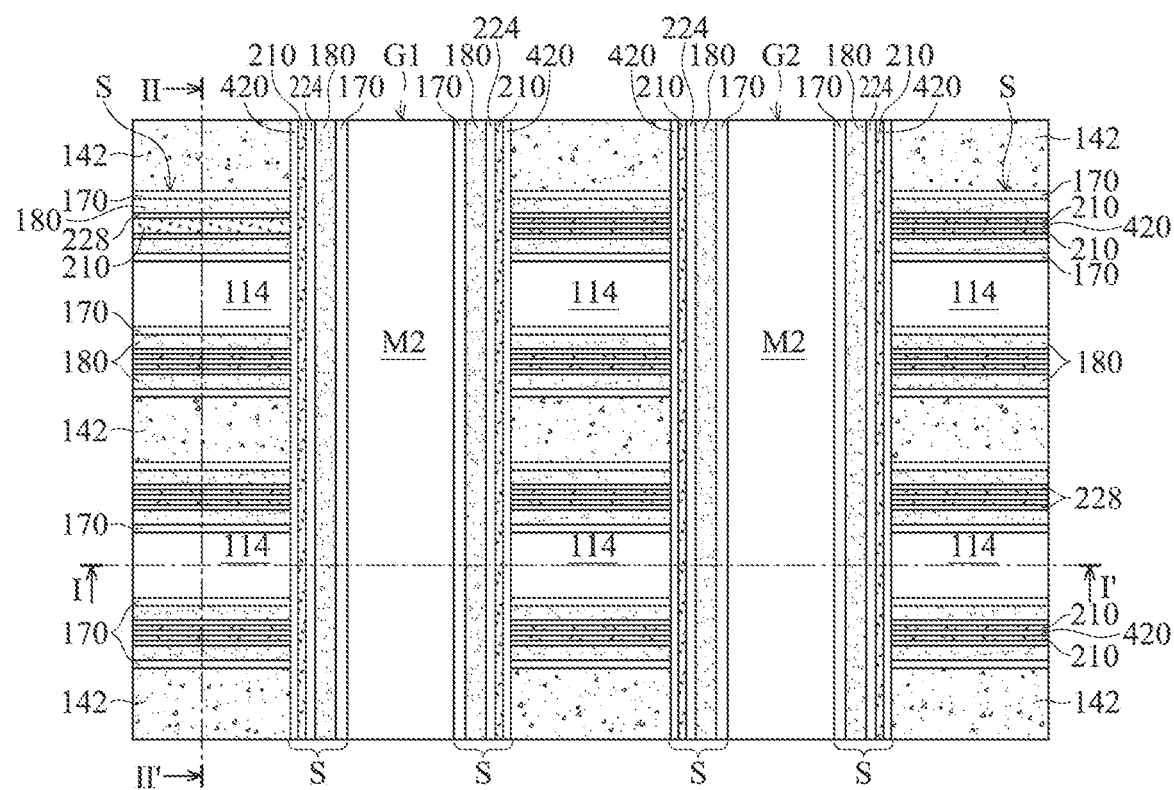
Figures 1, 4C:
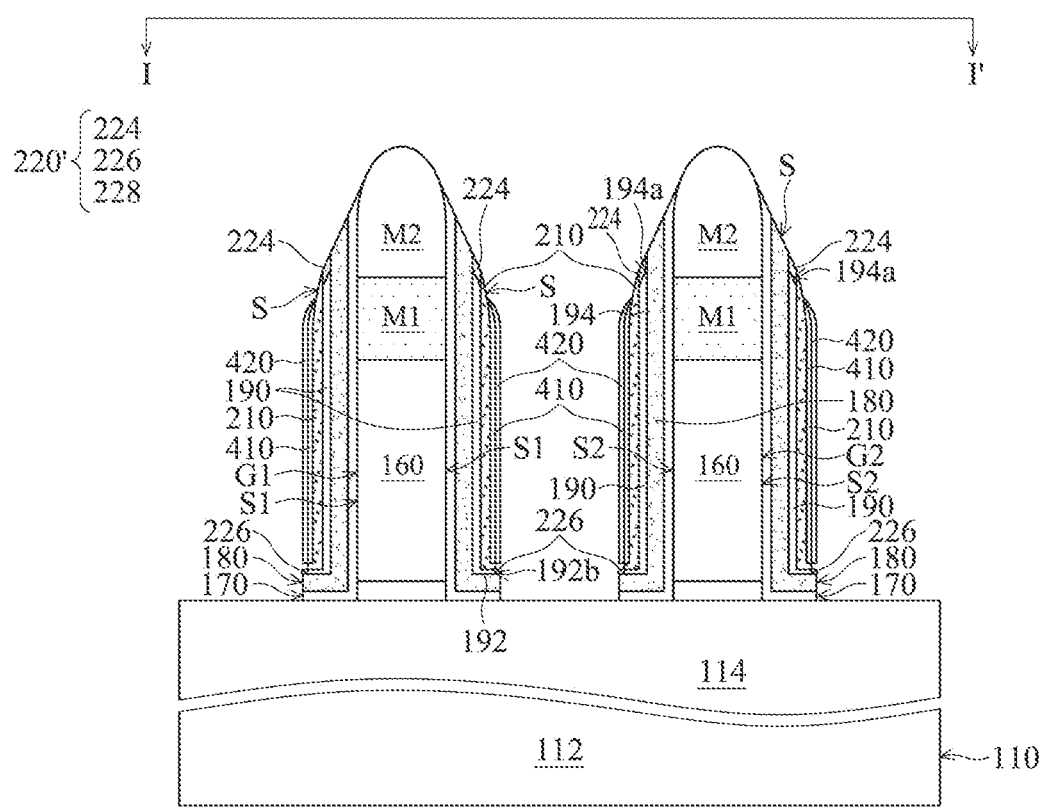
Figures 2, 4C:
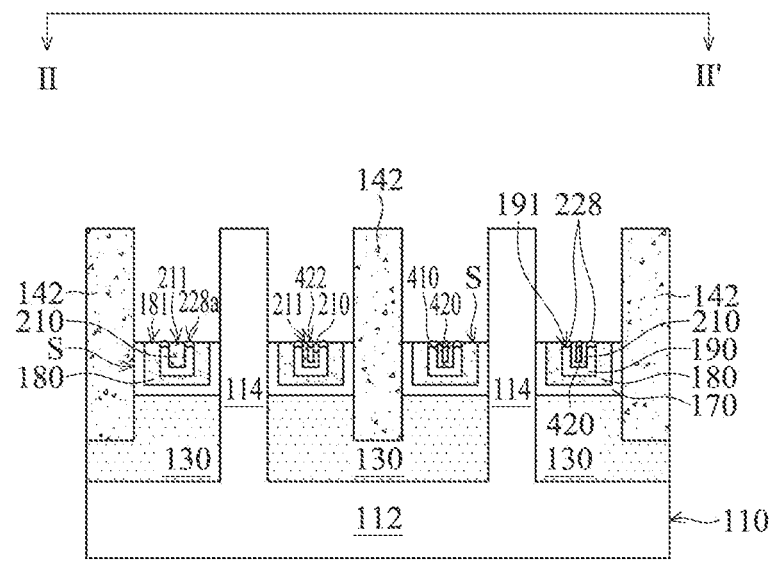
Figure 4D:
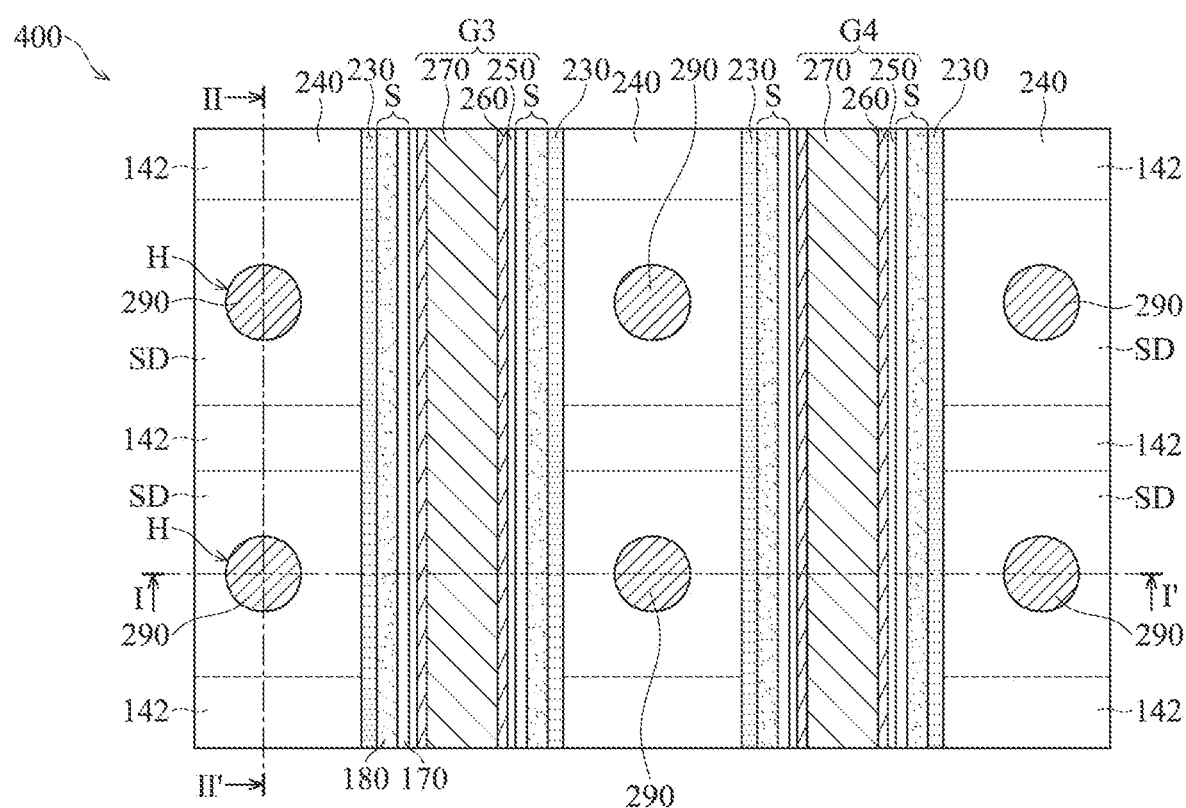
Figures 1, 4D:
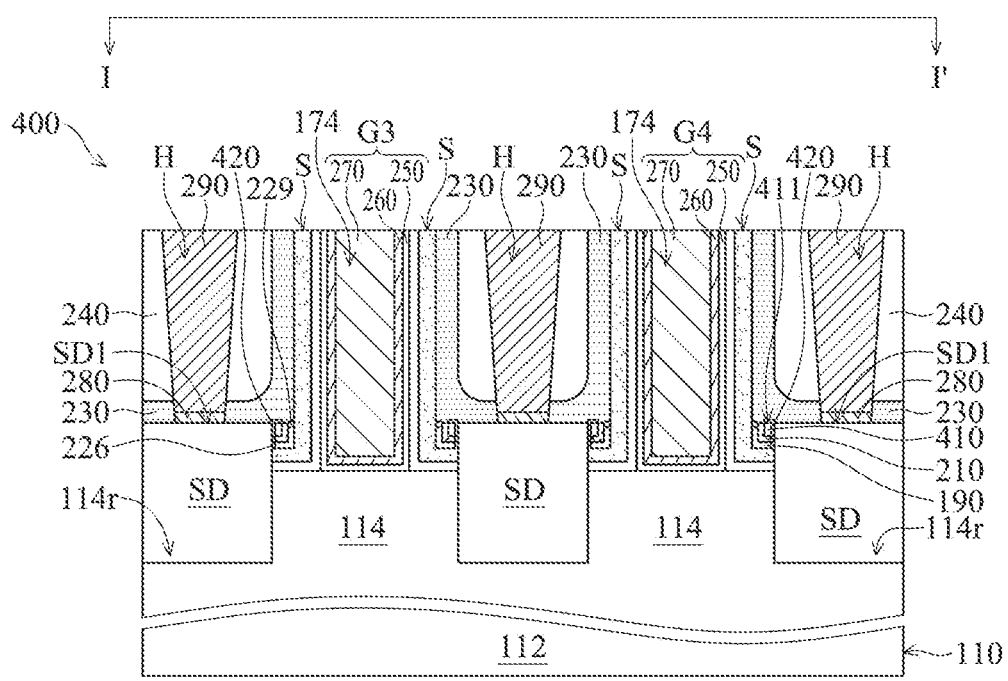
Figures 2, 4D:
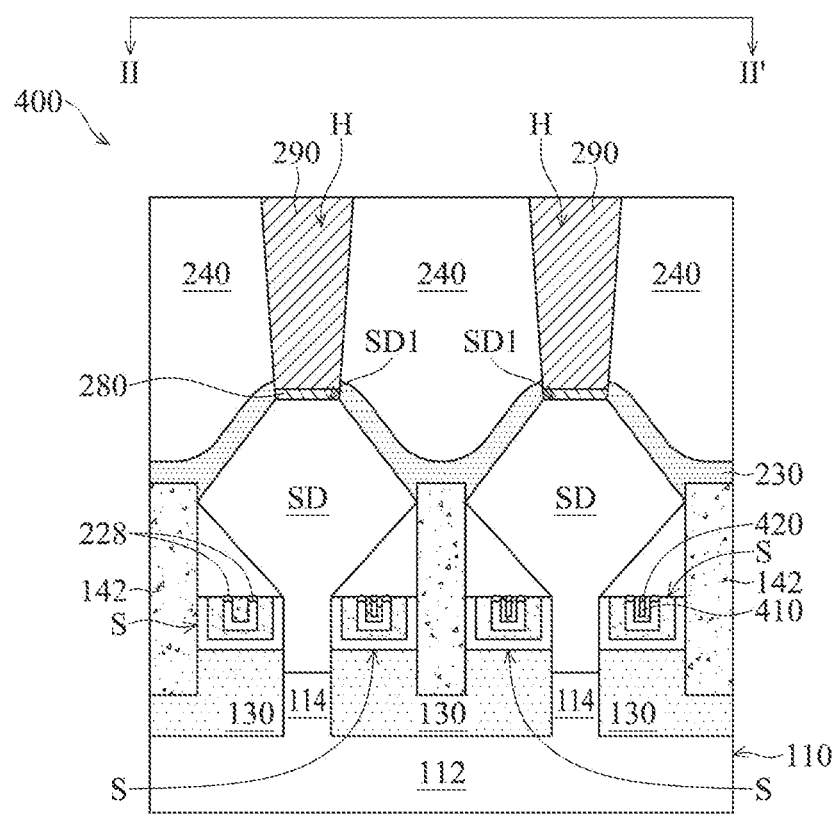

FIGS. 4A-4D are top views of various stages of a process for forming a semiconductor device structure, in accordance with some embodiments. FIGS. 4A-1 to 4D-1 are cross-sectional side views illustrating the semiconductor device structure along a sectional line I-I' in FIGS. 4A-4D, in accordance with some embodiments. FIGS. 4A-2 to 4D-2 are cross-sectional side views illustrating the semiconductor device structure along a sectional line II-II' in FIGS. 4A-4D, in accordance with some embodiments.

After the step of FIG. 2B, as shown in FIGS. 4A, 4A-1 and 4A-2, a silicon rich layer 410 is formed over the protection layer 210, in accordance with some embodiments. The silicon rich layer 410 conformally covers the upper surface 211 of the protection layer 210, in accordance with some embodiments. The silicon rich layer 410 has bottom portions 412, sidewall portions 414, and upper portions 416, in accordance with some embodiments.

The bottom portions 412 are over the bottom portions 212 of the protection layer 210, in accordance with some embodiments. The sidewall portions 414 are over the sidewall portions 214 of the protection layer 210, in accordance with some embodiments. The upper portions 416 are over the upper portions 216 of the protection layer 210, in accordance with some embodiments. As shown in FIG. 4A-1, the silicon rich layer 410 has a thickness T410 ranging from about 2.3 Å to about 12 Å, in accordance with some embodiments.

The material and the forming method of the silicon rich layer 410 are similar to or the same as that of the silicon rich layer 190, in accordance with some embodiments. In some embodiments, the protection layer 210 and the silicon rich layers 190 and 410 are formed in the same chamber, such as an atomic layer deposition chamber. That is, the protection layer 210 and the silicon rich layers 190 and 410 are formed in situ, in accordance with some embodiments. The protection layer 210 and the silicon rich layers 190 and 410 are formed using atomic layer deposition processes, in accordance with some embodiments.

As shown in FIG. 4A-2, the protection layer 210 conformally covers the upper surface 191 of the silicon rich layer 190 and has trenches 213 in the trenches 193 of the silicon rich layer 190, in accordance with some embodiments. The silicon rich layer 410 is formed over the upper surface 211 of the protection layer 210 and in the trenches 213, in accordance with some embodiments.

In some embodiments, as shown in FIG. 4A-2, if the trench 193 (e.g. the left one) is narrower or the protection layer 210 is thicker, the trench 193 is filled with the protection layer 210 and therefore the trench 213 is not formed.

Afterwards, as shown in FIGS. 4B, 4B-1 and 4B-2, the step of FIG. 2C is performed to partially remove the top portions 216 and 416 and the bottom portions 212 and 412 of the protection layer 210 and the silicon rich layer 410, in accordance with some embodiments.

After the removal process, the protection layer 210 and the silicon rich layer 410 cover the sidewall portions 194 and expose the bottom portions 192 and the upper portions 196 of the silicon rich layer 190, in accordance with some embodiments.

As shown in FIGS. 4B, 4B-1, and 4B-2, after the removal process, an oxide layer 220 is formed over the exposed portions of the silicon rich layer 190, and an oxide layer 420 is formed over the silicon rich layer 410, in accordance with some embodiments.

The oxide layer 220 is in direct contact with the silicon rich layer 190, in accordance with some embodiments. The oxide layer 420 is in direct contact with the silicon rich layer 410, in accordance with some embodiments.

The oxide layer 220 has portions 222 and 223, in accordance with some embodiments. The portions 222 are formed over the bottom portions 192 of the silicon rich layer 190, in accordance with some embodiments. The portions 223 are formed over the upper portions 196 of the silicon rich layer 190, in accordance with some embodiments.

The oxide layer 420 is formed by oxidation of the exposed surface part of the silicon rich layer 410, and therefore the oxide layer 420 and the silicon rich layer 410 have the same semiconductor element, in accordance with some embodiments. The semiconductor element includes silicon, in accordance with some embodiments. The oxide layer 420 is made of silicon oxide or silicon oxide nitride, in accordance with some embodiments.

Since the etching selectivity of silicon nitride to silicon oxide (or silicon oxide nitride) is high, the etching process is stopped at the oxide layers 220 and 420, in accordance with some embodiments. Therefore, the formation of the oxide layers 220 and 420 prevents over etching of the protection layer 210, which protects the corner portions 170c and 180c of the dielectric layers 170 and 180 from being etched, in accordance with some embodiments. Therefore, the yield of the etching process is improved, in accordance with some embodiments.

Furthermore, the formation of the silicon rich layer 410 and the oxide layer 420 is able to prevent over etching of the protection layer 210, which reduces the required thickness of the protection layer 210, in accordance with some embodiments. Therefore, the aspect ratio of the gap GA between the oxide layer 420 over the gate stack G1 and the oxide layer 420 over the gate stack G2 may be reduced.

As shown in FIGS. 4C, 4C-1, and 4C-2, the step of FIG. 2D is performed to partially remove the oxide layer 220 and the top portions 196, 186 and 176 and the bottom portions 192, 182, and 172 of the silicon rich layer 190, the dielectric layer 180, and the dielectric layer 170, in accordance with some embodiments. In some embodiments (not shown), the oxide layer 420 and the silicon rich layer 410 are partially or completely removed in this step.

As shown in FIGS. 4C, 4C-1, and 4C-2, an oxide layer 220' is formed over the exposed portions of the silicon rich layer 190 exposed by the protection layer 210, in accordance with some embodiments. The oxide layer 220' is in direct contact with the silicon rich layer 190, in accordance with some embodiments.

The oxide layer 220' has portions 224, 226 and 228, in accordance with some embodiments. The portions 224 cover the top surfaces 194a of the sidewall portions 194 of the silicon rich layer 190, in accordance with some embodiments. The portions 226 cover sidewalls 192b of the bottom portions 192 of the silicon rich layer 190, in accordance with some embodiments.

As shown in FIG. 4C-2, the portions 228 cover the upper surface 191 of the silicon rich layer 190 between the dielectric fins 142 and the fin portions 114, in accordance with some embodiments. As shown in FIG. 4C-2, the oxide layer 420 is formed over the silicon rich layer 410 and has an upper surface 422, in accordance with some embodiments. The upper surface 422 is a convex curved surface, in accordance with some embodiments. The upper surface 422 protrudes from the upper surfaces 181 and 211 of the dielectric layer 180 and the protection layer 210, in accordance with some embodiments.

As shown in FIGS. 4C-1 and 4C-2, the remaining protection layer 210, the remaining silicon rich layers 190 and 410, the remaining dielectric layers 170 and 180, and the oxide layers 220' and 420 together form a spacer structure S, in accordance with some embodiments. The spacer structure S remains over the sidewalls S1 and S2 of the gate stacks G1 and G2 and opposite sidewalls of the mask layers M1 and M2, in accordance with some embodiments.

As shown in FIGS. 4D, 4D-1 and 4D-2, the steps of FIGS. 2E-2J are performed to form the source/drain structures SD, remove the portions 224 of the oxide layer 220', the upper portions of the silicon rich layers 190 and 410, the protection layer 210, and the oxide layer 420, form the oxide layer 229, the etch stop layer 230, the dielectric layer 240, the gate stacks G3 and G4, the silicide layer 280, and the contact structures 290, in accordance with some embodiments.

Since the oxidation of the exposed upper surface 411 of the silicon rich layer 410 occurs after the removal process for removing the upper portions of the silicon rich layer 190, the oxide layer 420 extends onto the upper surface 411 of the silicon rich layer 410 after the removal process, in accordance with some embodiments. In this step, a semiconductor device structure 400 is substantially formed, in accordance with some embodiments.

Processes and materials for forming the semiconductor device structures 300 and 400 may be similar to, or the same as, those for forming the semiconductor device structure 200 described above. Elements designated by the same reference numbers as those in FIGS. 1A to 4D-2 have the structures, the materials, and the forming methods that are similar or the same. Therefore, the detailed descriptions thereof will not be repeated herein.

Figure 5:
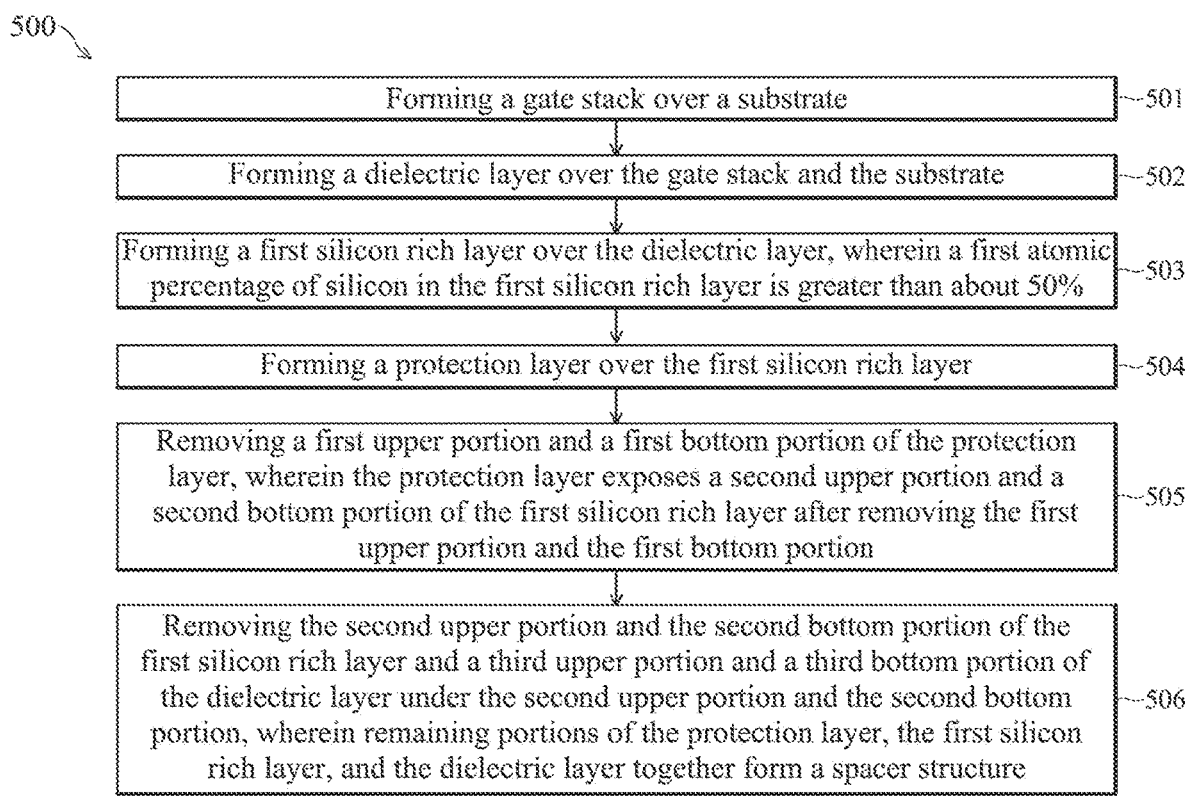
FIG. 5 is a flow chart of an example method for fabricating an example semiconductor device structure, in accordance with some embodiments.

FIG. 5 is a flow chart of an example method for fabricating an example semiconductor device structure, in accordance with some embodiments. Referring now to FIG. 5, the flow chart of the method 500 of forming a semiconductor device structure is illustrated according to various aspects of the present disclosure.

The method 500 is merely an example and is not intended to limit the present disclosure beyond what is explicitly recited in the claims. Additional operations can be provided before, during, and after the method 500, and some operations described can be replaced, eliminated, or moved around for additional embodiments of the method 500.

At operation 501, referring to FIG. 5, the method 500 forms a gate stack over a substrate, in accordance with some embodiments. At operation 502, referring to FIG. 5, the method 500 forms a dielectric layer over the gate stack and the substrate, in accordance with some embodiments.

At operation 503, referring to FIG. 5, the method 500 forms a first silicon rich layer over the dielectric layer, in accordance with some embodiments. A first atomic percentage of silicon in the first silicon rich layer is greater than about 50%, in accordance with some embodiments. At operation 504, referring to FIG. 5, the method 500 forms a protection layer over the first silicon rich layer, in accordance with some embodiments.

At operation 505, referring to FIG. 5, the method 500 removes a first upper portion and a first bottom portion of the protection layer, in accordance with some embodiments. The protection layer exposes a second upper portion and a second bottom portion of the first silicon rich layer after removing the first upper portion and the first bottom portion, in accordance with some embodiments.

At operation 506, referring to FIG. 5, the method 500 removes the second upper portion and the second bottom portion of the first silicon rich layer and a third upper portion and a third bottom portion of the dielectric layer under the second upper portion and the second bottom portion, in accordance with some embodiments. The remaining portions of the protection layer, the first silicon rich layer, and the dielectric layer together form a spacer structure, in accordance with some embodiments.

The unique fabrication process flow and the resulting IC device structure of the present disclosure offer advantages over conventional devices. It is understood, however, that no particular advantage is required, other embodiments may offer different advantages, and that not all advantages are necessarily disclosed herein. One advantage is that the yield of the etching process for forming a spacer structure is improved. Specifically, the methods (for forming the semiconductor device structure) form a silicon rich layer in a spacer structure. The silicon rich layer is formed between a dielectric layer thereunder and a protection layer thereover. The silicon rich layer is used as an etch stop layer to prevent over etching of the protection layer thereover and therefore protect the dielectric layer when patterning the protection layer using the etching process. Therefore, the silicon rich layer improves the yield of the etching process.

In accordance with some embodiments, a semiconductor device structure is provided. The semiconductor device structure includes a substrate. The semiconductor device structure includes a gate stack disposed over the substrate. The semiconductor device structure includes a spacer structure disposed over a sidewall of the gate stack. The spacer structure includes a dielectric layer, a silicon rich layer, and a protection layer, the dielectric layer is formed between the gate stack and the silicon rich layer, the silicon rich layer is formed between the dielectric layer and the protection layer, and a first atomic percentage of silicon in the silicon rich layer is greater than about 50%. The semiconductor device structure includes a source/drain structure disposed over the substrate. The spacer structure is formed between the source/drain structure and the gate stack.

In accordance with some embodiments, a semiconductor device structure is provided. The semiconductor device structure includes a substrate. The semiconductor device structure includes a gate stack disposed over the substrate. The semiconductor device structure includes a source/drain structure disposed over the substrate. The semiconductor device structure includes a spacer structure disposed over a sidewall of the source/drain structure. The spacer structure includes a dielectric layer, a first silicon rich layer, and a protection layer, the dielectric layer covers the sidewall of the source/drain structure, the first silicon rich layer is embedded in the dielectric layer, the protection layer is embedded in the first silicon rich layer, and a first atomic percentage of silicon in the first silicon rich layer is greater than about 50%.

In accordance with some embodiments, a method for forming a semiconductor device structure is provided. The method includes forming a gate stack over a substrate. The method includes forming a dielectric layer over the gate stack and the substrate. The method includes forming a first silicon rich layer over the dielectric layer, wherein a first atomic percentage of silicon in the first silicon rich layer is greater than about 50%. The method includes forming a protection layer over the first silicon rich layer. The method includes removing a first upper portion and a first bottom portion of the protection layer. The protection layer exposes a second upper portion and a second bottom portion of the first silicon rich layer after removing the first upper portion and the first bottom portion. The method includes removing the second upper portion and the second bottom portion of the first silicon rich layer and a third upper portion and a third bottom portion of the dielectric layer under the second upper portion and the second bottom portion, wherein remaining portions of the protection layer, the first silicon rich layer, and the dielectric layer together form a spacer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a gate stack disposed over the substrate;
   a spacer structure disposed over a sidewall of the gate stack, wherein the spacer structure comprises a dielectric layer, a silicon rich layer, and a protection layer, wherein the dielectric layer is disposed between the gate stack and the silicon rich layer, wherein the silicon rich layer is disposed between the dielectric layer and the protection layer, wherein a first atomic percentage of silicon in the silicon rich layer is greater than about 50%; and
   a source/drain structure disposed over the substrate, wherein the spacer structure is disposed between the source/drain structure and the gate stack, and wherein a portion of a side surface of the source/drain structure extends to a side surface of at least one of: the dielectric layer, the silicon rich layer, or the protection layer.

2. The semiconductor device structure as claimed in claim 1, wherein the first atomic percentage of silicon in the silicon rich layer is greater than a second atomic percentage of silicon in the protection layer.

3. The semiconductor device structure as claimed in claim 1, wherein the spacer structure further comprises an oxide layer disposed over a sidewall of the silicon rich layer.

4. The semiconductor device structure as claimed in claim 3, wherein the oxide layer is in direct contact with the silicon rich layer.

5. The semiconductor device structure as claimed in claim 4, wherein the oxide layer is disposed between the dielectric layer and the protection layer.

6. The semiconductor device structure as claimed in claim 4, wherein the oxide layer is in direct contact with the source/drain structure.

7. The semiconductor device structure as claimed in claim 1, wherein the first atomic percentage of silicon in the silicon rich layer decreases toward the protection layer.

8. The semiconductor device structure as claimed in claim 1, wherein the silicon rich layer is thinner than both the protection layer and the dielectric layer in a direction perpendicular to a sidewall of the gate stack.

9. The semiconductor device structure as claimed in claim 1, further comprising:
   an oxide layer disposed over an upper surface of the silicon rich layer.

10. A semiconductor device structure, comprising:
    a substrate;
    a gate stack disposed over the substrate;
    a source region and a drain region disposed on opposite sides of the gate stack; and
    a spacer structure disposed over a sidewall of the source region or the drain region, wherein the spacer structure comprises a dielectric layer, a first silicon rich layer, and a protection layer, wherein the dielectric layer covers the sidewall of the source region or the drain region, wherein the first silicon rich layer is embedded in the dielectric layer, wherein the protection layer is embedded in the first silicon rich layer, and wherein a first atomic percentage of silicon in the first silicon rich layer is greater than about 50%.

11. The semiconductor device structure as claimed in claim 10, further comprising:
    an oxide layer disposed over an upper surface of the first silicon rich layer.

12. The semiconductor device structure as claimed in claim 10, wherein the protection layer has a curved upper surface.

13. The semiconductor device structure as claimed in claim 10, further comprising:
    a second silicon rich layer embedded in the protection layer, wherein a second atomic percentage of silicon in the second silicon rich layer is greater than about 50%.

14. The semiconductor device structure as claimed in claim 13, further comprising:
    an oxide layer disposed over an upper surface of the second silicon rich layer.

15. A semiconductor device structure, comprising:
    a substrate;
    a gate structure disposed over the substrate in a cross-sectional side view;
    a spacer structure disposed over a sidewall of the gate structure in the cross-sectional side view, wherein the spacer structure comprises a dielectric layer, a silicon-containing layer, and a protective layer, wherein the dielectric layer is disposed between the gate structure and the silicon-containing layer, wherein the silicon-containing layer is disposed between the dielectric layer and the protective layer, wherein the an atomic percentage of silicon in the silicon-containing layer is greater than an atomic percentage of silicon in the protective layer, and wherein an uppermost surface of the protection layer has a lower vertical elevation than an uppermost surface of the dielectric layer in a cross-sectional side view; and
    a source/drain structure disposed over the substrate in the cross-sectional side view, wherein the spacer structure is disposed between the source/drain structure and the gate structure.

16. The semiconductor device structure of claim 15, wherein the atomic percentage of silicon in the silicon-containing layer is greater than about 50%.

17. The semiconductor device structure of claim 15, wherein the atomic percentage of silicon in the silicon-containing layer decreases toward the protective layer.

18. The semiconductor device structure of claim 15, wherein:
    the spacer structure further comprises an oxide layer disposed over a sidewall of the silicon-containing layer; and
    the oxide layer extends to the silicon-containing layer.

19. The semiconductor device structure of claim 18, wherein:
    the oxide layer is disposed between the dielectric layer and the protective layer; and
    the oxide layer extends to the source/drain structure.

20. The semiconductor device structure of claim 15, wherein the silicon-containing layer is thinner than the protective layer or the dielectric layer.

* * * * *